US012720872B2

(12) United States Patent
Feng et al.

(10) Patent No.: US 12,720,872 B2
(45) Date of Patent: Aug. 25, 2026

(54) DISPLAY SUBSTRATE, MANUFACTURING METHOD THEREOF, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 438 days.

(21) Appl. No.: 18/259,550

(22) PCT Filed: Aug. 30, 2022

(86) PCT No.: PCT/CN2022/115849
§ 371 (c)(1),
(2) Date: Jun. 27, 2023

(87) PCT Pub. No.: WO2024/044967
PCT Pub. Date: Mar. 7, 2024

(65) Prior Publication Data
US 2024/0395830 A1 Nov. 28, 2024

(51) Int. Cl.
*H10D 89/60* (2025.01)
*H10D 86/40* (2025.01)

(52) U.S. Cl.
CPC ......... *H10D 89/911* (2025.01); *H10D 86/441* (2025.01); *H10D 89/931* (2025.01)

(58) Field of Classification Search
CPC ... H10D 89/911; H10D 89/931; H10D 86/441
See application file for complete search history.

(56) References Cited

U.S. PATENT DOCUMENTS

2015/0187750 A1 7/2015 Kim et al.
2017/0102594 A1 4/2017 Hu et al.
(Continued)

FOREIGN PATENT DOCUMENTS

CN 202550507 U 11/2012
CN 104392990 A 3/2015
(Continued)

*Primary Examiner* — Peter M Albrecht
(74) *Attorney, Agent, or Firm* — DINSMORE & SHOHL LLP

(57) ABSTRACT

The present disclosure provides a display substrate, a manufacturing method thereof and a display device. The display substrate includes: a base substrate; a signal line on the base substrate; a thin film transistor on the base substrate, wherein the thin film transistor is electrically connected to the signal line, and the thin film transistor includes: an active layer, a first insulating layer on a side of the active layer away from the base substrate, a gate on a side of the first insulating layer away from the base substrate, and a source and a drain each electrically connected to the active layer; and a semiconductor structure comprising a semiconductor layer, wherein the semiconductor layer is in a same layer as the active layer, and the semiconductor layer is spaced apart from the signal line.

19 Claims, 15 Drawing Sheets

(56) References Cited

U.S. PATENT DOCUMENTS

| | | | | |
|---|---|---|---|---|
| 2017/0104016 | A1 | 4/2017 | Wang | |
| 2017/0110478 | A1 | 4/2017 | Gai et al. | |
| 2018/0204830 | A1 | 7/2018 | Liu et al. | |
| 2020/0006452 | A1* | 1/2020 | Lee | H10D 89/911 |
| 2020/0350309 | A1 | 11/2020 | Long | |
| 2022/0045180 | A1 | 2/2022 | Xiao et al. | |

FOREIGN PATENT DOCUMENTS

| | | | |
|---|---|---|---|
| CN | 104752420 | A | 7/2015 |
| CN | 104900633 | A | 9/2015 |
| CN | 105304645 | A | 2/2016 |
| CN | 105810677 | A | 7/2016 |
| CN | 207896091 | U | 9/2018 |
| CN | 208904019 | U | 5/2019 |
| CN | 110061062 | A | 7/2019 |
| CN | 114299873 | A | 4/2022 |
| CN | 114446260 | A | 5/2022 |
| GB | 2557403 | A | 6/2018 |

* cited by examiner 211
2111
213
2112
C
21121
21122
448
451
431(4317)
53
441
444
536
220
C'
443
42
442
433(4339)
432(4328)
4410
535
453
212
452
21224
449
21223
2122
2121

DISPLAY SUBSTRATE, MANUFACTURING METHOD THEREOF, AND DISPLAY DEVICE

TECHNICAL FIELD

The present disclosure relates to a display substrate, a manufacturing method thereof, and a display device.

BACKGROUND

In the field of display, an oxide process has relatively high uniformity, which makes the oxide process often applied in the manufacturing process of the display device.

SUMMARY

According to an aspect of the present disclosure, a display substrate is provided. The display substrate comprises: a base substrate; a signal line on the base substrate; a thin film transistor on the base substrate, wherein the thin film transistor is electrically connected to the signal line, and the thin film transistor comprises: an active layer, a first insulating layer on a side of the active layer away from the base substrate, a gate on a side of the first insulating layer away from the base substrate, and a source and a drain each electrically connected to the active layer; and a semiconductor structure comprising a semiconductor layer, wherein the semiconductor layer is in a same layer as the active layer, and the semiconductor layer is spaced apart from the signal line.

In some embodiments, the semiconductor structure further comprises a connecting portion electrically connected to the semiconductor layer, the connecting portion being spaced apart from the signal line by a gap.

In some embodiments, the signal line comprises a protrusion, wherein an orthographic projection of the protrusion on the base substrate at least partially overlaps with an orthographic projection of the semiconductor layer on the base substrate.

In some embodiments, the signal line comprises a first signal line and a second signal line; and the connecting portion comprises a first connecting portion and a second connecting portion, wherein the first connecting portion is electrically connected to a first end of the semiconductor layer through a first conductive via hole, the first connecting portion is spaced apart from the first signal line by a first gap, the second connecting portion is electrically connected to a second end of the semiconductor layer through a second conductive via hole, and the second connecting portion is spaced apart from the second signal line by a second gap.

In some embodiments, the first signal line is a first gate line, and the second signal line is a second gate line; and the first connecting portion is in a same layer as the first gate line, and the second connecting portion is in a same layer as the second gate line.

In some embodiments, the signal line comprises a protrusion, the protrusion being spaced apart from the connecting portion by the gap.

In some embodiments, the first signal line comprises a first protrusion, wherein the first protrusion is spaced apart from the first connecting portion by the first gap; and the second signal line comprises a second protrusion, wherein the second protrusion is spaced apart from the second connecting portion by the second gap.

In some embodiments, the signal line further comprises a third signal line, the third signal line being electrically connected to a third protrusion through a third conductive via hole; and the connecting portion further comprises a third connecting portion, wherein the third connecting portion is electrically connected to a third end of the semiconductor layer through a fourth conductive via hole and the third connecting portion is spaced apart from the third protrusion by a third gap.

In some embodiments, the first signal line is a first gate line, the second signal line is a second gate line, and the third signal line is a power supply voltage line, a common ground line, a data line or a sensing line; and the third connecting portion is in a same layer as the first gate line or the second gate line, and in a same layer as the third protrusion.

In some embodiments, the first connecting portion comprises: a first portion electrically connected to the first end of the semiconductor layer through the first conductive via hole, and a second portion electrically connected to the first portion through a fifth conductive via hole, wherein the second portion is spaced apart from the first signal line by the first gap, the first portion is in a same layer as the source or the drain, and the second portion is in a same layer as the first signal line; and the second connecting portion comprises: a third portion electrically connected to the second end of the semiconductor layer through the second conductive via hole, and a fourth portion electrically connected to the third portion through a sixth conductive via hole, wherein the fourth portion is spaced apart from the second signal line by the second gap, the third portion is in a same layer as the source or the drain, and the fourth portion is in a same layer as the second signal line.

In some embodiments, the third connecting portion comprises: a fifth portion electrically connected to the third end of the semiconductor layer through the fourth conductive via hole, and a sixth portion electrically connected to the fifth portion through a seventh conductive via hole, wherein the sixth portion is spaced apart from the third protrusion through the third gap, the fifth portion is in a same layer as the source or the drain, and the sixth portion is in a same layer as the first signal line or the second signal line.

In some embodiments, the first protrusion comprises: a first sub-protrusion connected to a main body portion of the first signal line, and a second sub-protrusion electrically connected to the first sub-protrusion through an eighth conductive via hole, wherein the second sub-protrusion is in a same layer as the source or the drain; the first connecting portion comprises a seventh portion electrically connected to the first end of the semiconductor layer through the first conductive via hole, wherein the seventh portion is spaced apart from the second sub-protrusion by the first gap, and the seventh portion is in a same layer as the source or the drain; the second protrusion comprises: a third sub-protrusion connected to a main body portion of the second signal line, and a fourth sub-protrusion electrically connected to the third sub-protrusion through a ninth conductive via hole, wherein the fourth sub-protrusion is in a same layer as the source or the drain; and the second connecting portion comprises an eighth portion electrically connected to the second end of the semiconductor layer through the second conductive via hole, wherein the eighth portion is spaced apart from the fourth sub-protrusion by the second gap, and the eighth portion is in a same layer as the source or the drain.

In some embodiments, the third protrusion comprises: a fifth sub-protrusion electrically connected to the third signal line through the third conductive via hole, and a sixth sub-protrusion electrically connected to the fifth sub-protrusion through a tenth conductive via hole, wherein the fifth sub-protrusion is in a same layer as the first signal line or the second signal line, and the sixth sub-protrusion is in a same layer as the source or the drain; and the third connecting portion comprises a ninth portion electrically connected to the third end of the semiconductor layer through the fourth conductive via hole, wherein the ninth portion is spaced apart from the sixth sub-protrusion by the third gap, and the ninth portion is in a same layer as the source or the drain.

In some embodiments, the signal line comprises a first signal line and a second signal line; and the semiconductor layer is between the first signal line and the second signal line, and the semiconductor layer is an integral semiconductor layer.

In some embodiments, a shape of the semiconductor layer is rectilinear, T-shaped or curved.

In some embodiments, the display substrate further comprises: a gate driving circuit and a pixel structure both on the base substrate, wherein the gate driving circuit and the pixel structure each are electrically connected to the signal line, and the pixel structure comprises the thin film transistor; wherein the semiconductor structure is between the gate driving circuit and the pixel structure.

In some embodiments, the display substrate further comprises: a dummy pixel structure between the gate driving circuit and the pixel structure, wherein the dummy pixel structure is not electrically connected to the signal line, the pixel structure is closer to the dummy pixel structure than the gate driving circuit, and the semiconductor structure is between the gate driving circuit and the dummy pixel structure.

In some embodiments, the gate driving circuit comprises: a first sub-gate driving circuit close to a first edge of the base substrate and a second sub-gate driving circuit close to a second edge of the base substrate, wherein the second edge is opposite to the first edge; and the semiconductor structure comprises: a first semiconductor structure between the first sub-gate driving circuit and the pixel structure, and a second semiconductor structure between the second sub-gate driving circuit and the pixel structure.

In some embodiments, the signal line comprises a first signal line and a second signal line adjacent to the first signal line, wherein the first semiconductor structure and the second semiconductor structure are between the first signal line and the second signal line.

In some embodiments, a resistivity of the semiconductor layer ranges from 1 kΩ·m to 10 kΩ·m.

In some embodiments, a width of the gap is less than a width of the signal line.

In some embodiments, a width of the gap ranges from 1 micron to 2 microns.

According to another aspect of the present disclosure, a display substrate is provided. The display substrate comprises: a base substrate; a signal line on the base substrate; a thin film transistor on the base substrate, wherein the thin film transistor is electrically connected to the signal line, and the thin film transistor comprises: an active layer, a first insulating layer on a side of the active layer away from the base substrate, a gate on a side of the first insulating layer away from the base substrate, and a source and a drain each electrically connected to the active layer; and a semiconductor structure comprising a semiconductor layer, wherein the semiconductor layer is in a same layer as the active layer, and the semiconductor layer is electrically connected to the signal line.

In some embodiments, the semiconductor structure further comprises a connecting portion electrically connected to the semiconductor layer, wherein the semiconductor layer is electrically connected to the signal line through the connecting portion.

According to another aspect of the present disclosure, a display device is provided. The display device comprising the display substrate described previously.

According to another aspect of the present disclosure, a manufacturing method for a display substrate is provided. The manufacturing method comprises: forming an active layer and a semiconductor layer on a base substrate, wherein the semiconductor layer is in a same layer as the active layer and spaced apart from the active layer, the active layer is a part of a thin film transistor, and the semiconductor layer is a part of a semiconductor structure; forming a signal line, wherein the signal line is electrically connected to the thin film transistor; forming a connecting portion electrically connected to the semiconductor layer, wherein the connecting portion is another part of the semiconductor structure, and the connecting portion is electrically connected to the signal line; and etching the connecting portion to form a gap.

According to another aspect of the present disclosure, a manufacturing method for a display substrate is provided. The manufacturing method comprises: forming an active layer and a semiconductor layer on a base substrate, wherein the semiconductor layer is in a same layer as the active layer and spaced apart from the active layer, the active layer is a part of a thin film transistor, and the semiconductor layer is a part of a semiconductor structure; forming a first insulating layer covering the active layer and the semiconductor layer; and forming a signal line on a side of the first insulating layer away from the base substrate, wherein the signal line is electrically connected to the thin film transistor, and the signal line comprises a protrusion, wherein an orthographic projection of the protrusion on the base substrate at least partially overlaps with an orthographic projection of the semiconductor layer on the base substrate.

Other features and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings which constitute a part of this specification, illustrate the embodiments of the present disclosure, and together with this specification, serve to explain the principles of the present disclosure.

The present disclosure may be more explicitly understood from the following detailed description with reference to the accompanying drawings, in which.

Figure 1:
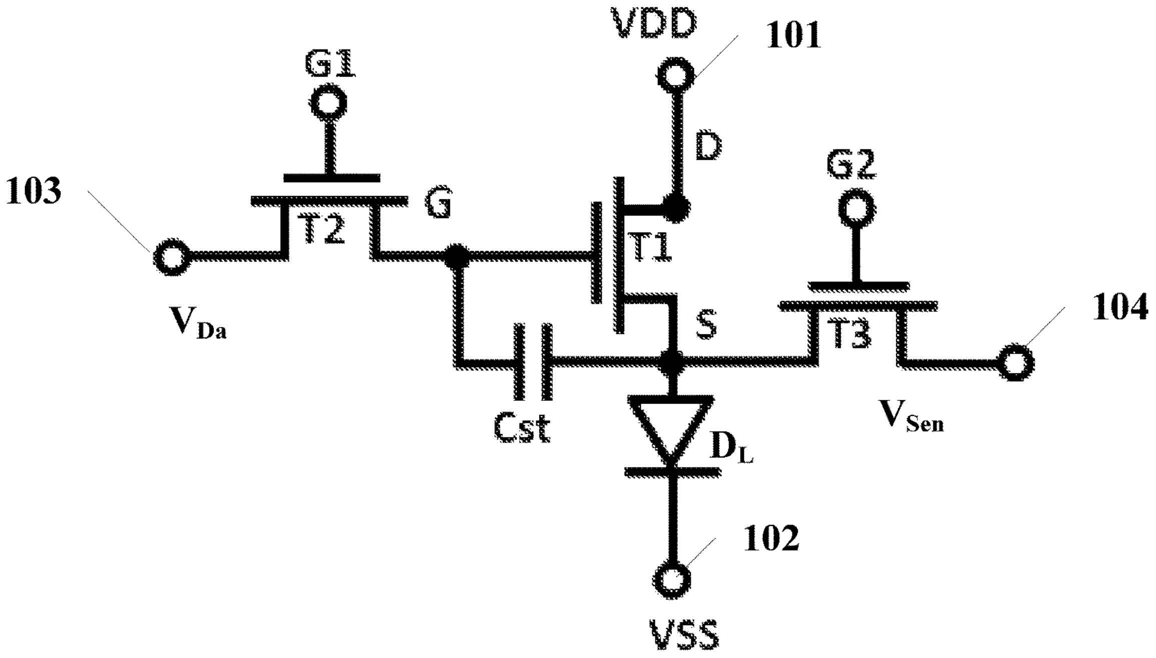
FIG. 1 is a schematic view showing circuit connection of a pixel structure of a display substrate according to an embodiment of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that in the manufacturing process of the related art, the process device may generate relatively severe static electricity. For example, in the oxide process, there might be an electrostatic phenomenon. For example, a point where some signal lines (for example, low-level lines) of a gate driving circuit overlap with a gate line of a pixel structure might be easily broken down by electrostatic charges. The electrostatic charges on the signal line described above will affect the reliability of the display device.

In view of this, an embodiment of the present disclosure provides a display substrate so as to be capable of acting as an electrostatic discharge.

FIG. 1 is a schematic view showing circuit connection of a pixel structure of a display substrate according to an embodiment of the present disclosure.

As shown in FIG. 1, the pixel structure comprises a first transistor T1, a second transistor T2, a third transistor T3, a light-emitting diode $D_L$ and a capacitor $C_{st}$.

A first terminal (for example, a drain terminal D) of the first transistor T1 is electrically connected to a power supply voltage terminal 101. The power supply voltage terminal 101 is electrically connected to a power supply voltage line (not shown), and The power supply voltage terminal 101 is configured to transmit a power supply voltage VDD received from the power supply voltage line to the first transistor T1. A second terminal (for example, a source terminal S) of the first transistor T1 is electrically connected to an anode terminal of the light-emitting diode $D_L$ and a first terminal of the capacitor $C_{st}$. A gate G of the first transistor T1 is electrically connected to a second terminal of the capacitor $C_{st}$.

A cathode terminal of the light-emitting diode $D_L$ is electrically connected to a common ground terminal 102. The common ground terminal 102 is electrically connected to a common ground line. The common ground terminal 102 is configured to receive a common ground terminal voltage VSS from the common ground line.

A first terminal of the second transistor T2 is electrically connected to a data signal terminal 103. The data signal terminal 103 is electrically connected to a data line (not shown in FIG. 1). The data signal terminal 103 is configured to transmit a data signal $V_{Da}$ received from the data line to the second transistor. A second terminal of the second transistor T2 is electrically connected to the gate of the first transistor T1. A gate of the second transistor is electrically connected to a first gate line (not shown). The first gate line is configured to provide a first gate signal G1.

A first terminal of the third transistor T3 is electrically connected to the second terminal of the first transistor T1, and a second terminal of the third transistor T3 is electrically connected to a sensing voltage terminal 104. The sensing voltage terminal 104 is electrically connected to a sensing line (not shown). The third transistor is configured to transmit a sensing voltage signal $V_{Sen}$. A gate of the third transistor T3 is electrically connected to a second gate line (not shown). The second gate line is configured to provide a second gate signal G2.

It can be seen that the above-described pixel structure is electrically connected to two gate lines, i.e., the first gate line and the second gate line.

Figure 2:
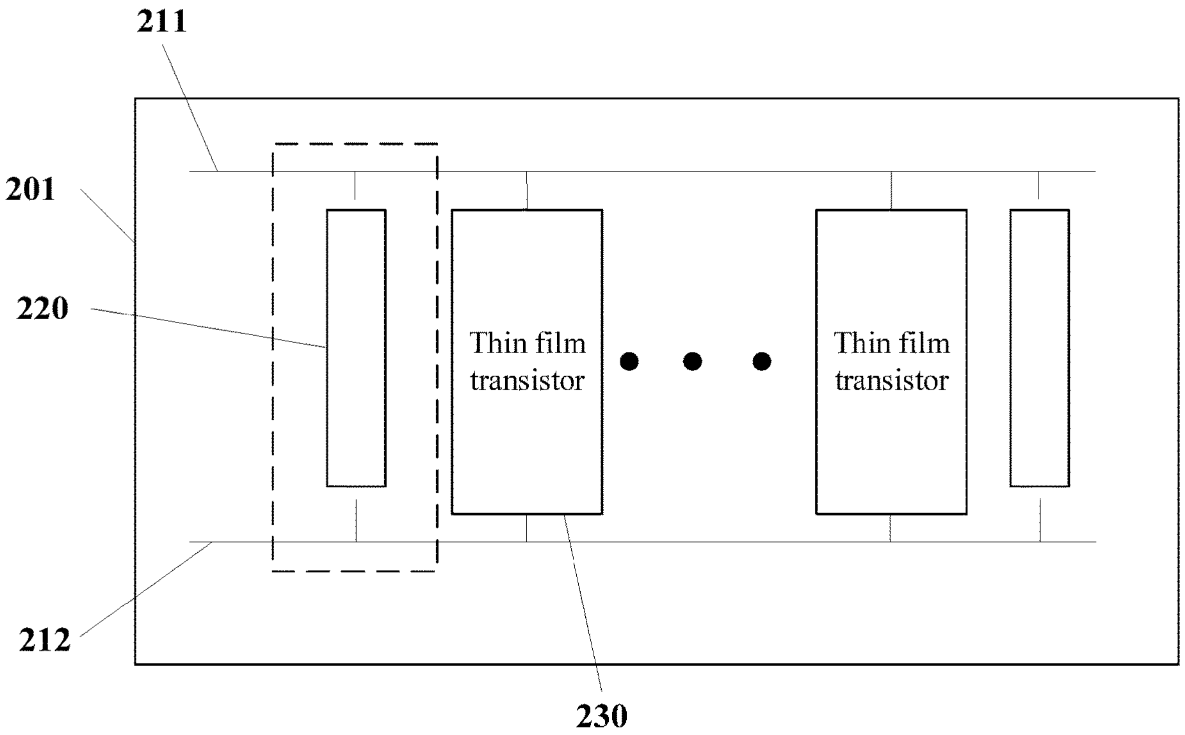
FIG. 2 is a schematic structural view showing a display substrate according to an embodiment of the present disclosure.

FIG. 2 is a schematic structural view showing a display substrate according to an embodiment of the present disclosure As shown in FIG. 2, the display substrate comprises a base substrate 201. For example, the base substrate is a hard substrate or a flexible substrate.

As shown in FIG. 2, the display substrate further comprises a signal line on the base substrate 201. For example, the signal line comprises a first signal line 211 and a second signal line 212. For example, the first signal line 211 is a first gate line, and the second signal line 212 is a second gate line. For example, the first gate line and the second gate line are a first gate line and a second gate line electrically connected to a pixel structure in FIG. 1.

It should be noted that although two signal lines 211 and 212 are shown in FIG. 2, the scope of the present disclosure is not limited thereto. For example, the number of the signal lines is one or more than two. Therefore, the scope of the present disclosure is not limited to the specific number of the signal line.

It should also be noted that although it is previously exemplified that the signal line comprises a first gate line and a second gate line, the scope of the present disclosure is not limited thereto. The signal line may also be another signal line, for example, a power supply voltage line, a common ground line, a data line or a sensing line. Therefore, the scope of the present disclosure is not limited to the specific form of the signal line.

As shown in FIG. 2, the display substrate further comprises a thin film transistor 230 on the base substrate 201, wherein the thin film transistor 230 is electrically connected to the signal line. For example, the thin film transistor 230 is electrically connected to the first signal line 211 and the second signal line 212 respectively. The thin film transistor 230 comprises: an active layer, a first insulating layer on a side of the active layer away from the base substrate, a gate on a side of the first insulating layer away from the base substrate, and a source and a drain each electrically connected to the active layer. The specific structure of the thin film transistor will be described later in conjunction with FIG. 3.

As shown in FIG. 2, the display substrate further comprises a semiconductor structure 220. The semiconductor structure 220 comprises a semiconductor layer. The semiconductor layer is in a same layer as the active layer, and the semiconductor layer is spaced apart from the signal line. The specific structure of the semiconductor structure 220 will be described in detail later in conjunction with the accompanying drawings.

In the display substrate, there might be electrostatic charges on the signal line, wherein the electrostatic charges may be discharged into the semiconductor layer of the semiconductor structure 220 by way of point discharge between the semiconductor structure 220 and the signal line. If there are excessive electrostatic charges, the electrostatic charges might also be discharged into another signal line through the semiconductor structure 220 and two point discharges. In this way, the purpose of electrostatic discharge is achieved.

The above-described semiconductor layer is spaced apart from the signal line, so that a signal (for example, the first gate signal) in one signal line (for example, the first signal line 211) is not transmitted to another signal line (for example, the second signal line 212) through the semiconductor structure during a normal operation process of the display substrate, thereby avoiding short-circuit. In this way, the display substrate operates normally.

In some embodiments, as shown in FIG. 2, two semiconductor structures 220 are provided between the first signal line 211 and the second signal line 212, two semiconductor structures 220 comprising one semiconductor structure close to a first edge of the base substrate and another semiconductor structure close to a second edge of the base substrate. The second edge is opposite to the first edge.

It should be noted that the scope of the present disclosure is not limited to the specific number of the semiconductor structure. For example, one or more than two semiconductor structures may be provided between two signal lines.

So far, a display substrate according to some embodiments of the present disclosure is provided. The display substrate comprises: a base substrate; a signal line on the base substrate; a thin film transistor on the base substrate, wherein the thin film transistor is electrically connected to the signal line, and the thin film transistor comprises: an active layer, a first insulating layer on a side of the active layer away from the base substrate, a gate on a side of the first insulating layer away from the base substrate, and a source and a drain each electrically connected to the active layer; and a semiconductor structure comprising a semiconductor layer, wherein the semiconductor layer is in a same layer as the active layer, and the semiconductor layer is spaced apart from the signal line. By providing the semiconductor structure in the display substrate, it is possible to achieve the effect of electrostatic discharge and improve the reliability of the display substrate without affecting the normal operation of the display substrate.

Figure 3:
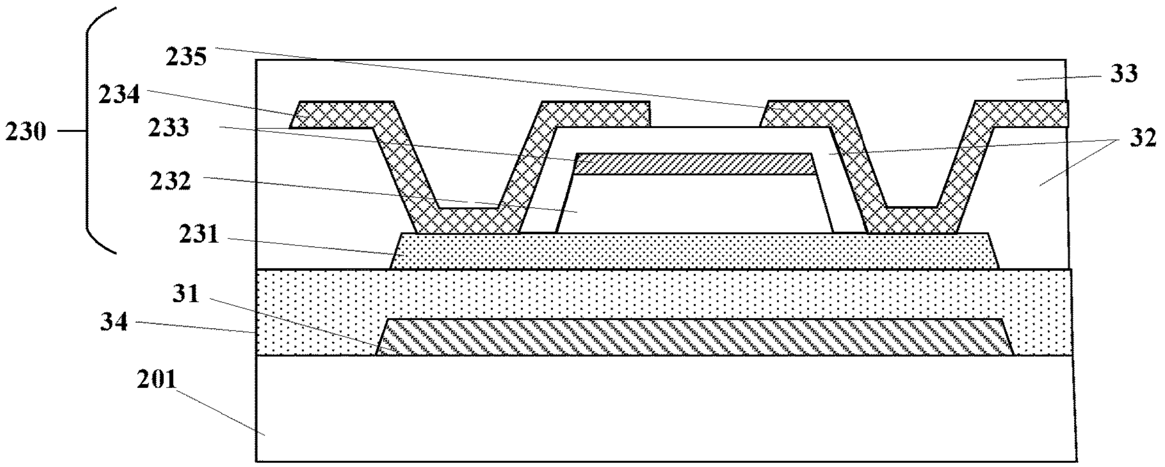
FIG. 3 is a schematic cross-sectional view showing a partial structure of a display substrate according to an embodiment of the present disclosure.

FIG. 3 is a schematic cross-sectional view showing a partial structure of a display substrate according to an embodiment of the present disclosure.

As shown in FIG. 3, the display substrate comprises a base substrate 201, a light shielding layer 31 on the base substrate 201, and a buffer layer 34 covering the light shielding layer 31. The display substrate further comprises a thin film transistor 230 on a side of the buffer layer 34 away from the base substrate 201. For example, a material of the buffer layer 34 comprises an inorganic insulating material (for example, silicon dioxide, silicon nitride, and/or the like).

As shown in FIG. 3, the thin film transistor comprises an active layer 231, a first insulating layer 232 on a side of the active layer 231 away from the base substrate 201, a gate 233 on a side of the first insulating layer 232 away from the base substrate 201, and a source 234 and a drain 235 each electrically connected to the active layer 231. For example, a material of the active layer 231 comprises a semiconductor material such as silicon. For example, a material of the first insulating layer 232 comprises an inorganic insulating material (for example, silicon dioxide, silicon nitride, and/or the like).

As shown in FIG. 3, the display substrate further comprises a second insulating layer 32 covering the active layer 231, the first insulating layer 232 and the gate 233. The second insulating layer 32 isolates the source 234 and the drain 235 from the gate 233 respectively. For example, a material of the second insulating layer 32 comprises an inorganic insulating material (for example, silicon dioxide, silicon nitride, and/or the like).

As shown in FIG. 3, the display substrate further comprises a passivation layer 33 covering the source 234, the drain 235 and the second insulating layer 32. For example, a material of the passivation layer 33 comprises an inorganic insulating material (for example, silicon dioxide, silicon nitride, and/or the like).

So far, a partial structure of a display substrate according to some embodiments of the present disclosure is described.

It should be noted that the display substrate shown in FIG. 3 shows a partial structure of the display substrate, but the scope of the present disclosure is not limited thereto. For example, the display substrate according to the embodiments of the present disclosure may also comprise other structures known to those skilled in the art, which will not be described in detail here.

Figure 4:
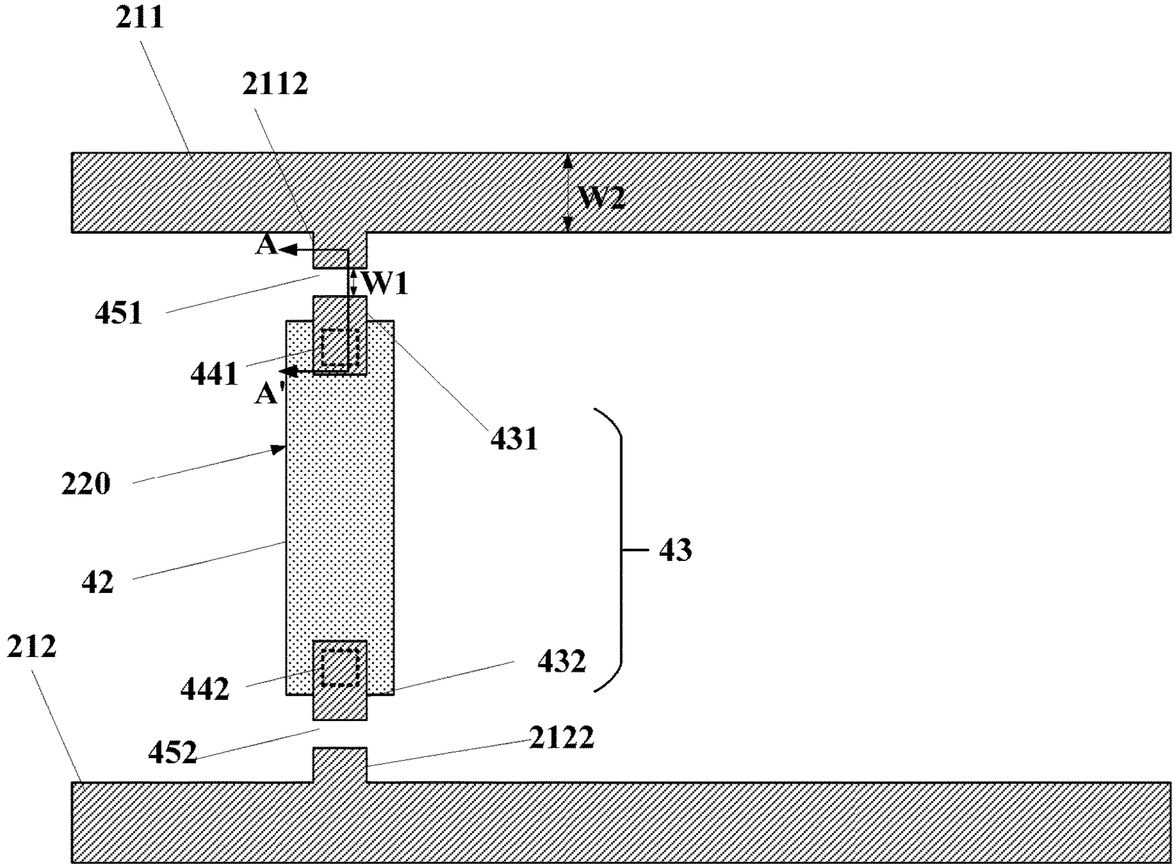
FIG. 4 is a schematic layout view showing a semiconductor structure of a display substrate according to an embodiment of the present disclosure.

FIG. 4 is a schematic layout view showing a semiconductor structure of a display substrate according to an embodiment of the present disclosure.

As shown in FIG. 4, the signal line comprises a first signal line 211 and a second signal line 212.

The semiconductor structure 220 comprises a semiconductor layer 42 and a connecting portion 43 electrically connected to the semiconductor layer 42. The semiconductor layer 42 is in a same layer as the active layer 231, and the connecting portion 43 is spaced apart from the signal line 211 (or 212) by a gap 451 (or 452). In this way, the semiconductor layer 42 is spaced apart from the signal line 211 (or 212). For example, a material of the semiconductor layer 42 is the same as a material of the active layer 231. Here, the semiconductor layer 42 and the active layer 231 are arranged in the same layer, so that the semiconductor layer and the active layer can be simultaneously formed by a single patterning process during the manufacturing process, thereby facilitating the manufacture of the semiconductor layer and the active layer.

In addition, the semiconductor structure contains a semiconductor layer, so that in the process of electrostatic discharge, the circumstance of instantaneous high current can be prevented, thereby preventing breakdown of the semiconductor structure.

As shown in FIG. 4, the semiconductor layer 42 is between the first signal line 211 and the second signal line 212, and the semiconductor layer 42 is an integral semiconductor layer. That is, for each semiconductor layer, the semiconductor layer between the first signal line and the second signal line is an integral semiconductor layer.

As shown in FIG. 4, a shape of the semiconductor layer 42 is rectilinear.

As shown in FIG. 4, the connecting portion 43 comprises a first connecting portion 431 and a second connecting portion 432. The first connecting portion 431 is electrically connected to a first end of the semiconductor layer 42 through a first conductive via hole 441. The first connecting portion 431 is spaced apart from the first signal line 211 by a first gap 451. The second connecting portion 432 is electrically connected to a second end of the semiconductor layer 42 through a second conductive via hole 442. The second connecting portion 432 is spaced apart from the second signal line 212 by a second gap 452. The above-described gap comprises the first gap 451 and the second gap 452.

For example, the first signal line 211 is a first gate line, and the second signal line 212 is a second gate line. The first connecting portion 431 is in a same layer as the first gate line 211, and the second connecting portion 432 is in a same layer as the second gate line. For example, the first gate line is in a same layer as the second gate line.

It should be noted that "a same layer" refers to a layer structure formed by forming a film layer for forming a specific pattern using the same film forming process, and then patterning the film layer by a single patterning process using the same mask. For example, two structural layers in the same layer may be located on a same structural layer, or may also be located on different structural layers. Two structural layers in the same layer might be at different heights or have different thicknesses.

In this way, the semiconductor structure may be formed during the process of forming the active layer and the gate of the thin film transistor, which is compatible with the manufacturing process of the thin film transistor and convenient for manufacturing the display substrate.

It should also be noted that although FIG. 4 shows that the connecting portion comprises two connecting portions, i.e., the first connecting portion and the second connecting portion, the scope of the present disclosure is not limited thereto. For example, the connecting portion may comprise one connecting portion, for example, only the first connecting portion or only the second connecting portion, so that electrostatic discharge can be achieved between the semiconductor structure and one signal line. For another example, the connecting portion may also comprise more than two connecting portions (for example, three connecting portions), so that the electrostatic discharge can be achieved between the semiconductor structure and more signal lines.

In some embodiments, the signal line comprises a protrusion, the protrusion being spaced apart from the connecting portion by a gap. For example, the first signal line 211 comprises a first protrusion 2112, wherein the first protrusion 2112 is spaced apart from the first connecting portion 431 by a first gap 451. For another example, the second signal line 212 comprises a second protrusion 2122, wherein the second protrusion 2122 is spaced apart from the second connecting portion 432 by a second gap 452. In the embodiment, the signal line comprises the protrusion, and the protrusion is spaced apart from the connecting portion by a gap, so that point discharge is more easily achieved between the protrusion and the semiconductor structure.

In some embodiments, as shown in FIG. 4, a width W1 of the gap is less than a width W2 of the signal line. Here, the width of the gap is a width of the gap in a direction perpendicular to an extension direction of a signal line corresponding to the gap (that is, a signal line closest to the gap), and the width of the signal line is a width of the signal line in a direction perpendicular to an extension direction of the signal line. For example, the width of the gap ranges from 1 micron to 2 microns. The above-described width of the gap is relatively easy to achieve point discharge.

In some embodiments, the gap is filled by an insulant. For example, the gap is filled by the passivation layer 33.

In some embodiments, a resistivity of the semiconductor layer 42 ranges from 1 kilohm·meter (kΩ·m) to 10 kΩ·m. Such resistivity can allow for a low current in the semiconductor layer, which prevents a high current from damaging the semiconductor layer or other structures. For example, the resistivity of the semiconductor layer 42 is 3 kΩ·m to 5 kΩ·m.

Figure 5:
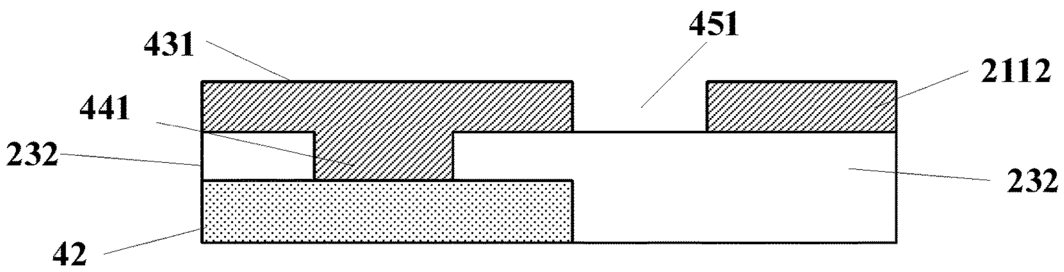
FIG. 5 is a schematic cross-sectional view showing a structure of a semiconductor structure taken along a line A-A' of FIG. 4 according to an embodiment of the present disclosure.

FIG. 5 is a schematic cross-sectional view showing a structure of a semiconductor structure taken along a line A-A' of FIG. 4 according to an embodiment of the present disclosure.

As shown in FIG. 5, the first insulating layer 232 covers the semiconductor layer 42. The first conductive via hole 441 passes through the first insulating layer 232, and the first connecting portion 431 and the first protrusion 2112 are on the first insulating layer 232.

FIG. 5 exemplarily shows a cross-sectional structure of the first conductive via hole 441, while a cross-sectional structure of the second conductive via hole 442 is similar to the cross-sectional structure of the first conductive via hole 441 shown in FIG. 5.

Figure 6:
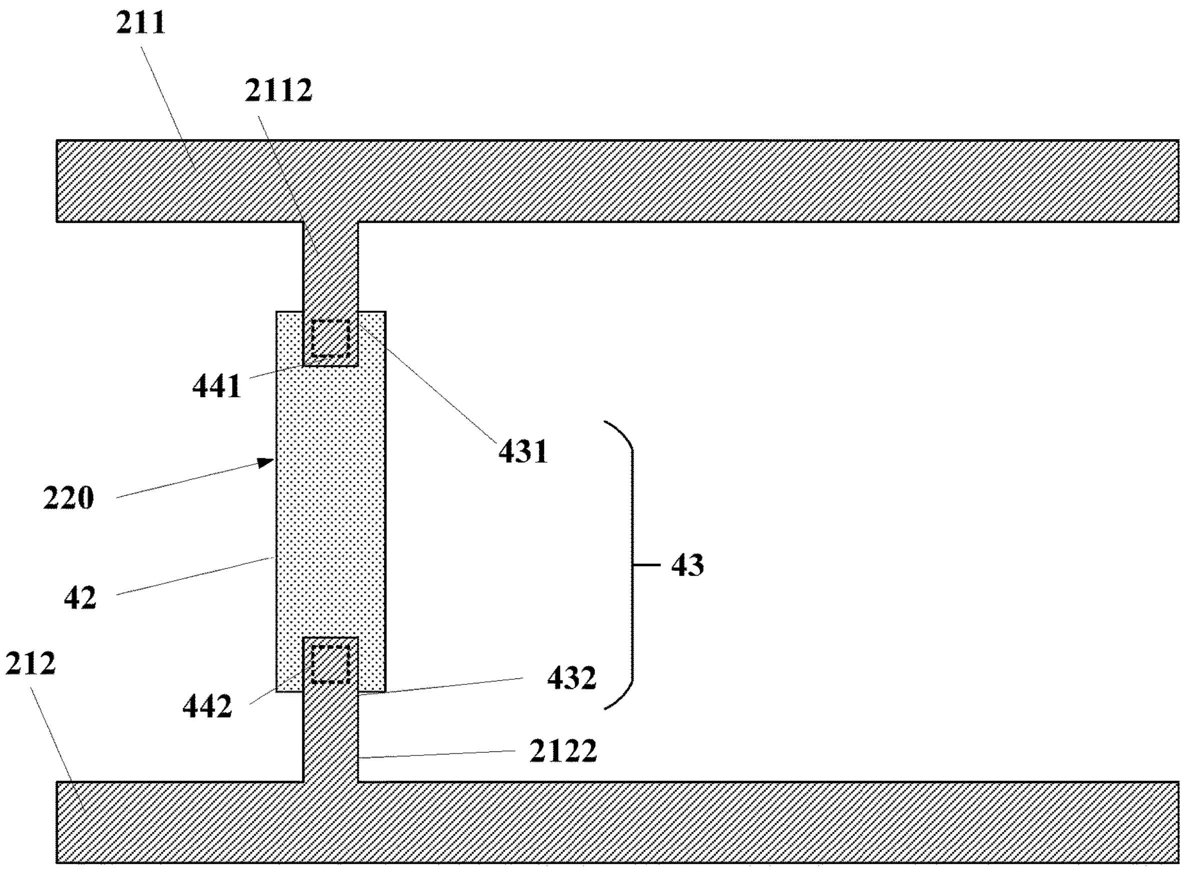
FIG. 6 is a schematic layout view showing a semiconductor structure of a display substrate according to another embodiment of the present disclosure.

FIG. 6 is a schematic layout view showing a semiconductor structure of a display substrate according to another embodiment of the present disclosure.

Compared with the semiconductor structure shown in FIG. 4, the semiconductor structure shown in FIG. 6 is different in that: the connecting portion of the semiconductor structure is electrically connected to the signal line and not spaced apart from the signal line by a gap. For example, as shown in FIG. 6, the first connecting portion 431 is connected to the first protrusion 2112 of the first signal line 211, and the second connecting portion 432 is connected to the second protrusion 2122 of the second signal line 212. That is, the semiconductor layer 42 is electrically connected to the first signal line 211 through the first connecting portion 431, and the semiconductor layer 42 is electrically connected to the second signal line 212 through the second connecting portion 432.

On such basis, the present disclosure also provides a display substrate according to other embodiments. The display substrate comprises: a base substrate; a signal line on the base substrate; a thin film transistor on the base substrate, wherein the thin film transistor is electrically connected to the signal line, and the thin film transistor comprises: an active layer, a first insulating layer on a side of the active layer away from the base substrate, a gate on a side of the first insulating layer away from the base substrate, and a source and a drain each electrically connected to the active layer; and a semiconductor structure comprising a semiconductor layer, wherein the semiconductor layer is in a same layer as the active layer, and the semiconductor layer is electrically connected to the signal line.

In some embodiments, the semiconductor structure further comprises a connecting portion electrically connected to the semiconductor layer, wherein the semiconductor layer is electrically connected to the signal line through the connecting portion.

Actually, during the manufacturing process of the display substrate, for example, charges might be accumulated on the first signal line 211 due to some processes (for example, a dry etching process), and these charges can be discharged into the semiconductor layer 42 by the semiconductor structure shown in FIG. 6, or discharged onto the second signal line 212 through the semiconductor layer 42 (which may form annular discharge), thereby achieving electrostatic discharge. It is possible to prevent electrostatic charges generated due to the processes from breaking down an overlapping point between different signal lines, for example a point where some signal lines (for example low-level lines) of the gate driving circuit overlap with the gate line of the pixel structure, and it is also possible to prevent breakdown of the channel of the edge pixel. Here, the overlap between different signal lines refers to the overlap of orthogonal projections of these different signal lines on the base substrate. In the subsequent process steps, in order to prevent short-circuit of the first signal line 211 and the second signal line 212, after the above-described electrostatic discharge process, the connecting portion of the semiconductor structure is etched and disconnected from the signal line by a mask etching process, thereby forming a gap, which forms the structure shown in FIG. 4.

In other words, the structure shown in FIG. 6 is a semiconductor structure formed during the manufacturing process of the display substrate, and the structure shown in FIG. 4 is formed by an etching process after the function of electrostatic discharge is achieved. In the structure shown in FIG. 4, electrostatic discharge can be to achieved by point discharge, thereby preventing accumulation of charges on the signal line.

Figure 7:
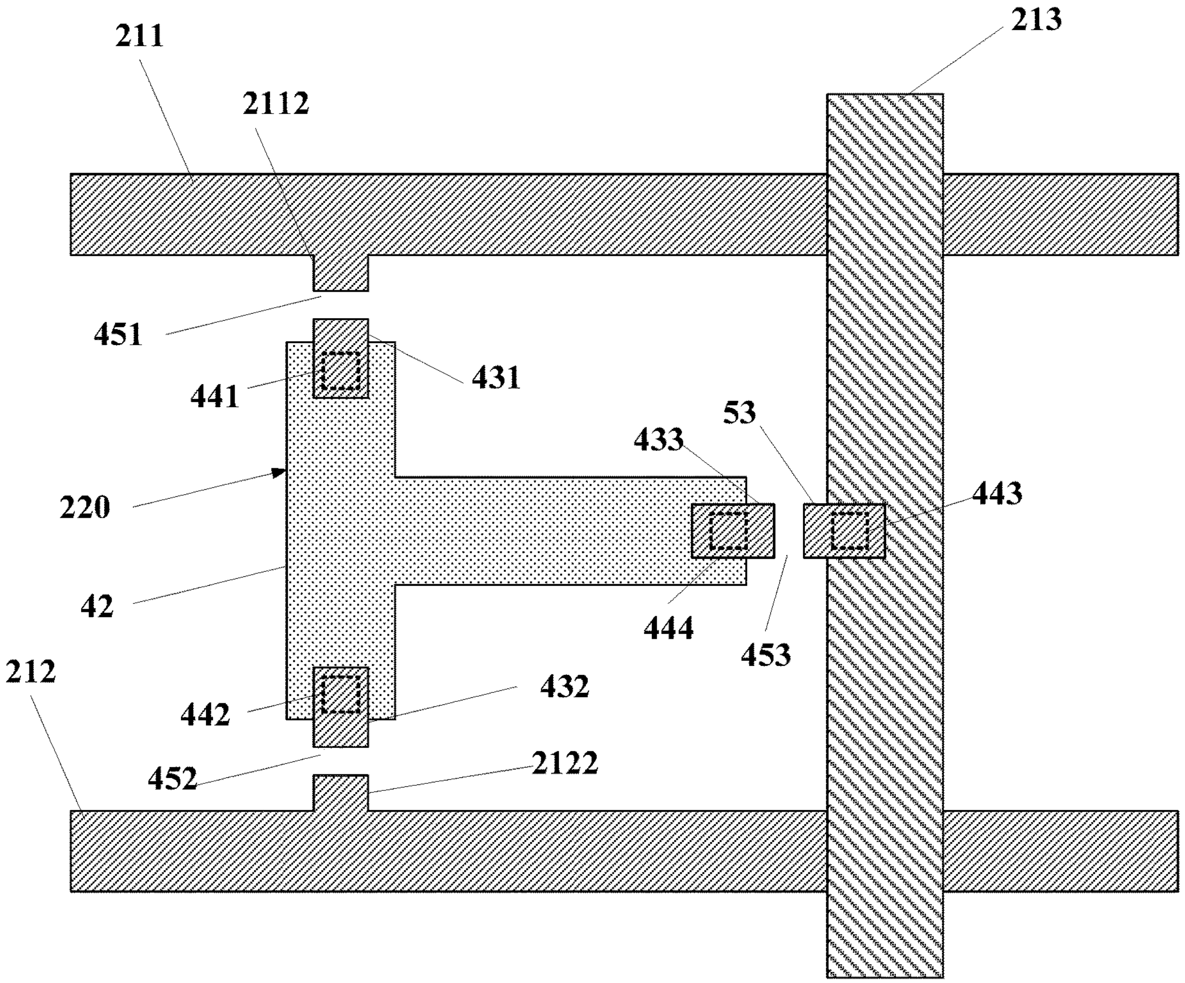
FIG. 7 is a schematic layout view showing a semiconductor structure of a display substrate according to another embodiment of the present disclosure.

FIG. 7 is a schematic layout view showing a semiconductor structure of a display substrate according to another embodiment of the present disclosure.

In FIG. 7, a shape of the semiconductor layer 42 of the semiconductor structure is T-shaped.

As shown in FIG. 7, the signal line comprises a third signal line 213 in addition to the first signal line 211 and the second signal line 212. The third signal line 213 is electrically connected to a third protrusion 53 through a third conductive via hole 443. For example, the third conductive via hole 443 passes through a third insulating layer (not shown), the third insulating layer being between a metal layer where the first signal line is located and a metal layer where the third signal line is located. Here, the third insulating layer is an insulating layer known to those skilled in the art, which will not be described in detail here.

The connecting portion of the semiconductor structure comprises a third connecting portion 433 in addition to the first connecting portion 431 and the second connecting portion 432. The third connecting portion 433 is electrically connected to a third end of the semiconductor layer 42 through a fourth conductive via hole 444. The above-described gap further comprises a third gap 453. The third connecting portion 433 is spaced apart from the third protrusion 53 by the third gap 453. In this way, point discharge between the third signal line and the semiconductor structure can be to achieved, thereby discharging the charges on the third signal line and improving the reliability of the display substrate.

For example, the first signal line 211 is a first gate line, the second signal line 212 is a second gate line, and the third signal line 213 is a power supply voltage line, a common ground line, a data line or a sensing line. The third connecting portion 433 is in a same layer as the first gate line or the second gate line, and in a same layer as the third protrusion 53. This facilitates the manufacture of the display substrate.

Figure 8:
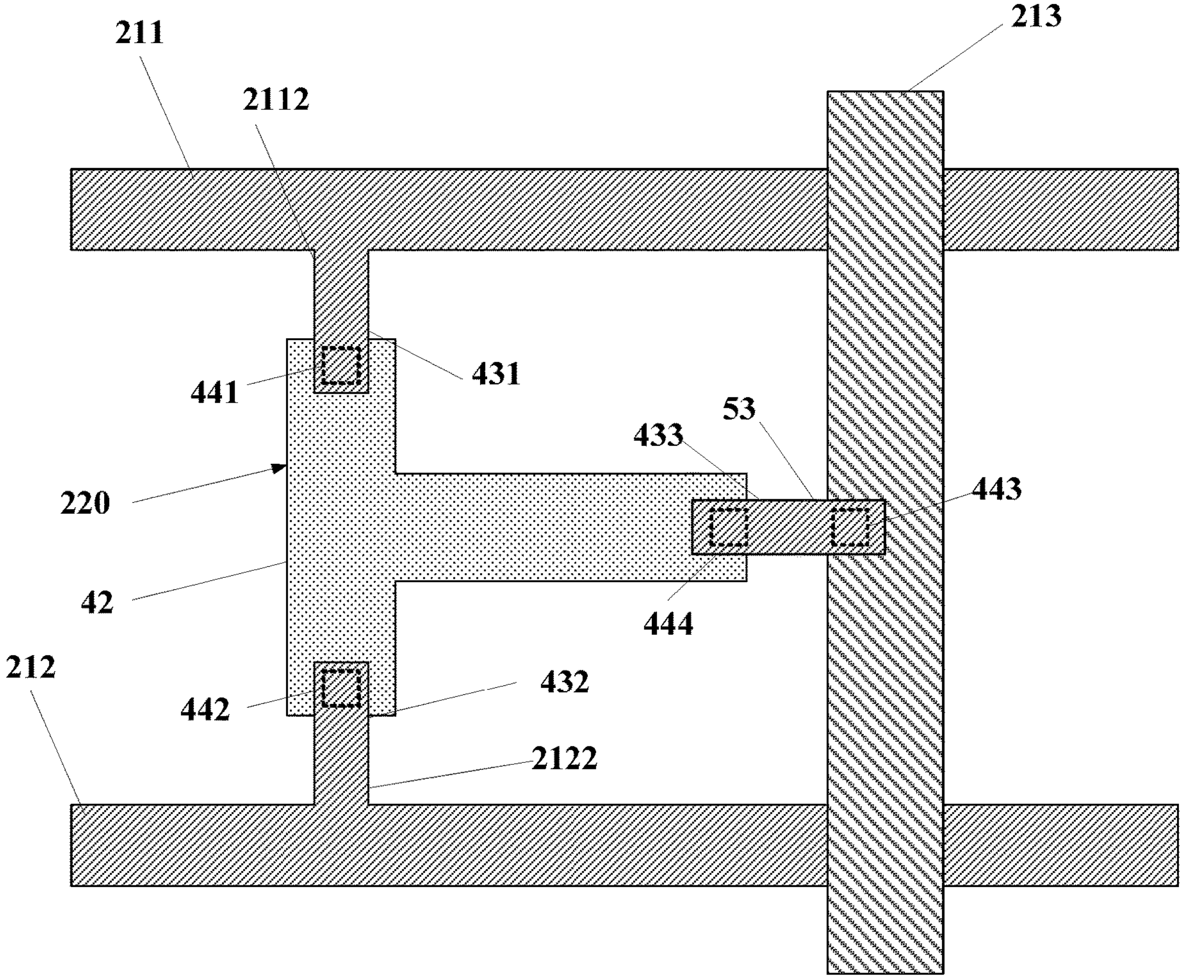
FIG. 8 is a schematic layout view showing a semiconductor structure of a display substrate according to another embodiment of the present disclosure.

FIG. 8 is a schematic layout view showing a semiconductor structure of a display substrate according to another embodiment of the present disclosure.

Compared with the semiconductor structure shown in FIG. 7, the semiconductor structure shown in FIG. 8 is different in that: the connecting portion of the semiconductor structure is electrically connected to the signal line and not spaced apart from the signal line by a gap. For example, as shown in FIG. 8, the first connecting portion 431 is connected to the first protrusion 2112 of the first signal line 211, the second connecting portion 432 is connected to the second protrusion 2122 of the second signal line 212, and the third connecting portion 433 is connected to the third protrusion 53, the third protrusion being electrically connected to the third signal line 213.

Similar to what is described above, the structure shown in FIG. 8 is a semiconductor structure formed during the manufacturing process of the display substrate, and the first signal line, the second signal line or the third signal line can achieve annular discharge through the semiconductor structure shown in FIG. 8. After the function of electrostatic discharge is achieved, the structure shown in FIG. 7 is formed by an etching process. In the structure shown in FIG. 7, electrostatic discharge can be achieved by point discharge, that is, electrostatic charges on the first signal line, the second signal line or the third signal line are discharged, thereby preventing accumulation of charges on the signal line.

In some embodiments, as described above, the thin film transistor further comprises the source 234 and the drain 235, wherein the source 234 and the drain 235 are electrically connected to the active layer 231.

Figure 9:
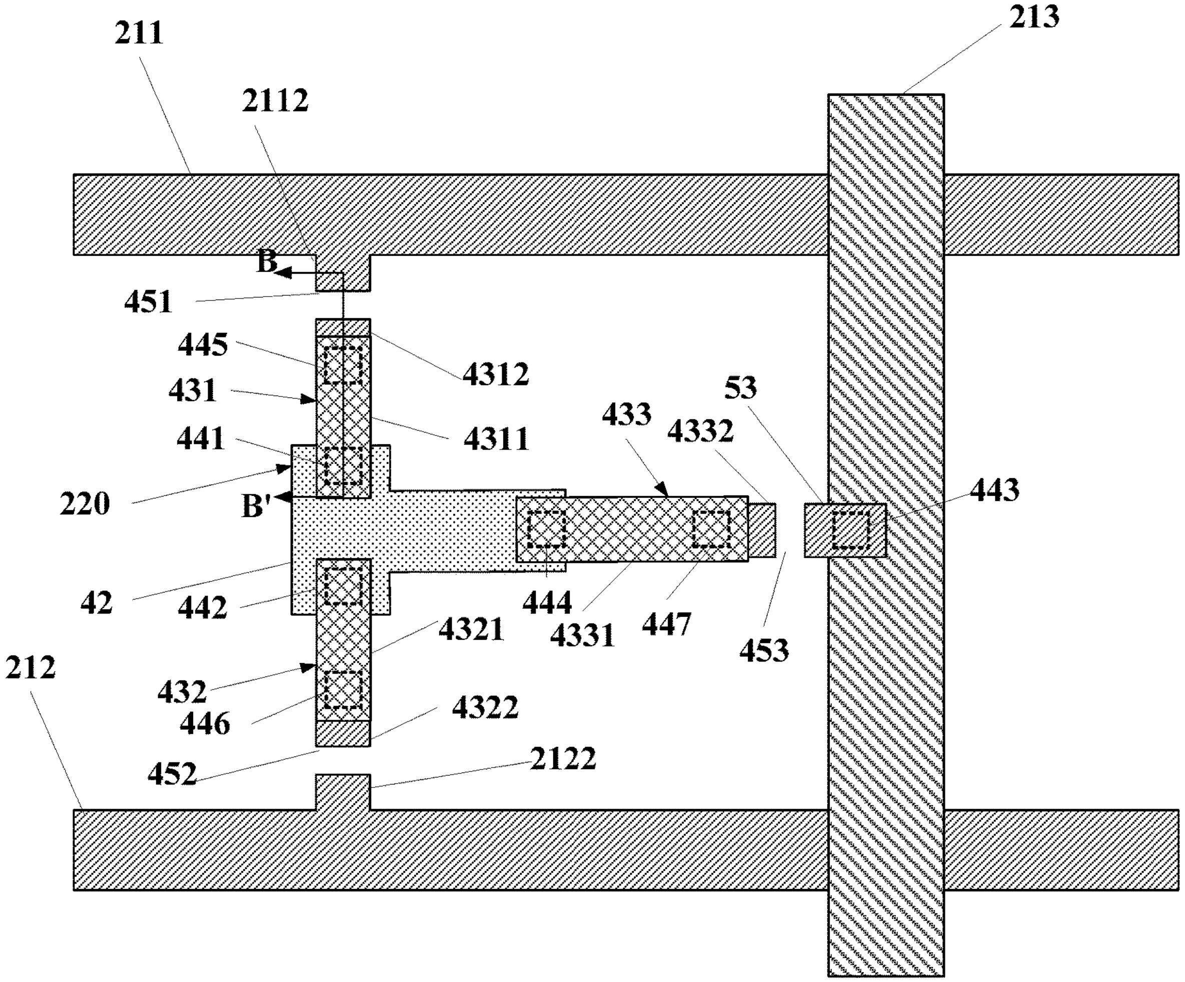
FIG. 9 is a schematic layout view showing a semiconductor structure of a display substrate according to another embodiment of the present disclosure.

FIG. 9 is a schematic layout view showing a semiconductor structure of a display substrate according to another embodiment of the present disclosure. FIG. 9 shows structures of the first connecting portion 431 and the second connecting portion 432 according to other embodiments of the present disclosure.

In the semiconductor structure shown in FIG. 9, the first connecting portion 431 comprises: a first portion 4311 electrically connected to the first end of the semiconductor layer 42 through the first conductive via hole 441, and a second portion 4312 electrically connected to the first portion 4311 through a fifth conductive via hole 445. The second portion 4312 is spaced apart from the first signal line 211 by the first gap 451. For example, the second portion 4312 is spaced apart from the first protrusion 2112 of the first signal line 211 by the first gap 451. The first portion 4311 is in a same layer as the source or the drain. The second portion 4312 is in a same layer as the first signal line 211.

In the semiconductor structure shown in FIG. 9, the second connecting portion 432 comprises a third portion 4321 electrically connected to the second end of the semiconductor layer 42 through the second conductive via hole 442, and a fourth portion 4322 electrically connected to the third portion 4321 through a sixth conductive via hole 446. The fourth portion 4322 is spaced apart from the second signal line 212 by the second gap 452. For example, the fourth portion 4322 is spaced apart from the second protrusion 2122 of the second signal line 212 by the second gap 452. The third portion 3421 is in a same layer as the source or the drain. The fourth portion 4322 is in a same layer as the second signal line 212.

The structures of the first connecting portion and the second connecting portion according to other embodiments are implemented above.

The above-described semiconductor structure can be formed during the process of forming the active layer, the gate, the source and the drain of the thin film transistor, thereby achieving compatibility with the manufacturing process of the thin film transistor and facilitating the manufacture of the display substrate.

FIG. 9 also shows a structure of a third connecting portion 433 according to other embodiments of the present disclosure.

As shown in FIG. 9, the third connecting portion 433 comprises: a fifth portion 4331 electrically connected to the third end of the semiconductor layer 42 through the fourth conductive via hole 444, and a sixth portion 4332 electrically connected to the fifth portion 4331 through a seventh conductive via hole 447. The sixth portion 4332 is spaced apart from the third protrusion 53 by the third gap 453. The fifth portion 4331 is in a same layer as the source or the drain. The sixth portion 4332 is in a same layer as the first signal line 211 or the second signal line 212.

The structure of the third connecting portion according to other embodiments is implemented above.

The above-described semiconductor structure can be formed during the process of forming the active layer, the gate, the source and the drain of the thin film transistor, thereby achieving compatibility with the manufacturing process of the thin film transistor and facilitating the manufacture of the display substrate.

It is to be noted that although FIG. 9 shows that the connecting portion comprises three connecting portions, i.e., the first connecting portion, the second connecting portion and the third connecting portion, the scope of the present disclosure is not limited thereto. For example, the connecting portion comprises at least one of the first connecting portion, the second connecting portion or the third connecting portion.

Figure 10:
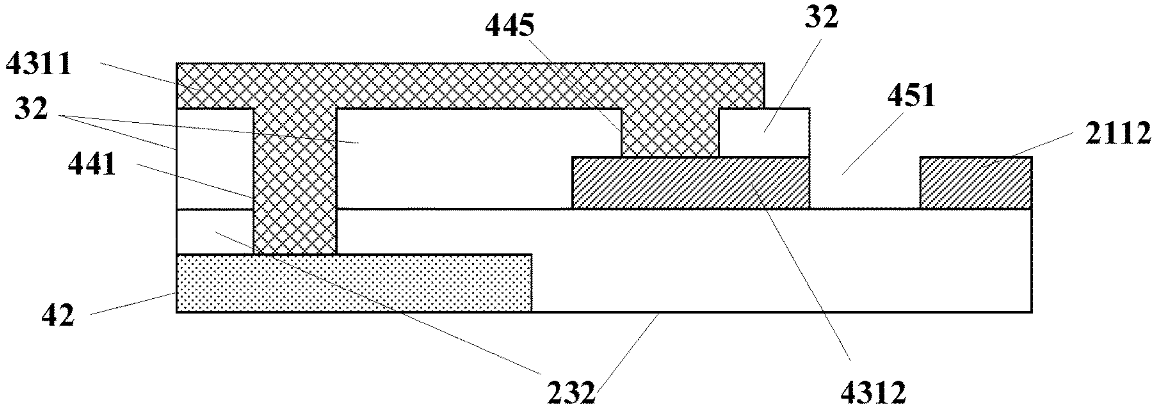
FIG. 10 is a schematic cross-sectional view showing a structure of a semiconductor structure taken along a line B-B' of FIG. 9 according to an embodiment of the present disclosure.

FIG. 10 is a schematic cross-sectional view showing a structure of a semiconductor structure taken along a line B-B' of FIG. 9 according to an embodiment of the present disclosure.

As shown in FIG. 10, the first insulating layer 232 covers at least a part of the semiconductor layer 42. The second insulating layer 32 covers a part of the first insulating layer 232. The first conductive via hole 441 passes through the first insulating layer 232 and the second insulating layer 32, and the fifth conductive via hole 445 passes through the second insulating layer 32. The first portion 4311 of the first connecting portion 431 is on the second insulating layer 32. The second portion 4312 of the first connecting portion 431 and the first protrusion 2112 are on the first insulating layer 232. The first gap 451 is on the first insulating layer 232.

FIG. 10 exemplarily shows the cross-sectional structures of the first conductive via hole 441 and the fifth conductive via hole 445, while a structure of the second conductive via hole 442 in FIG. 9 is similar to a structure of the first conductive via hole 441, and a structure of the sixth conductive via hole 446 in FIG. 9 is similar to a structure of the fifth conductive via hole 445. A structure of the fourth conductive via hole 444 in FIG. 9 is similar to the structure of the first conductive via hole 441 in FIG. 10.

Figure 11:
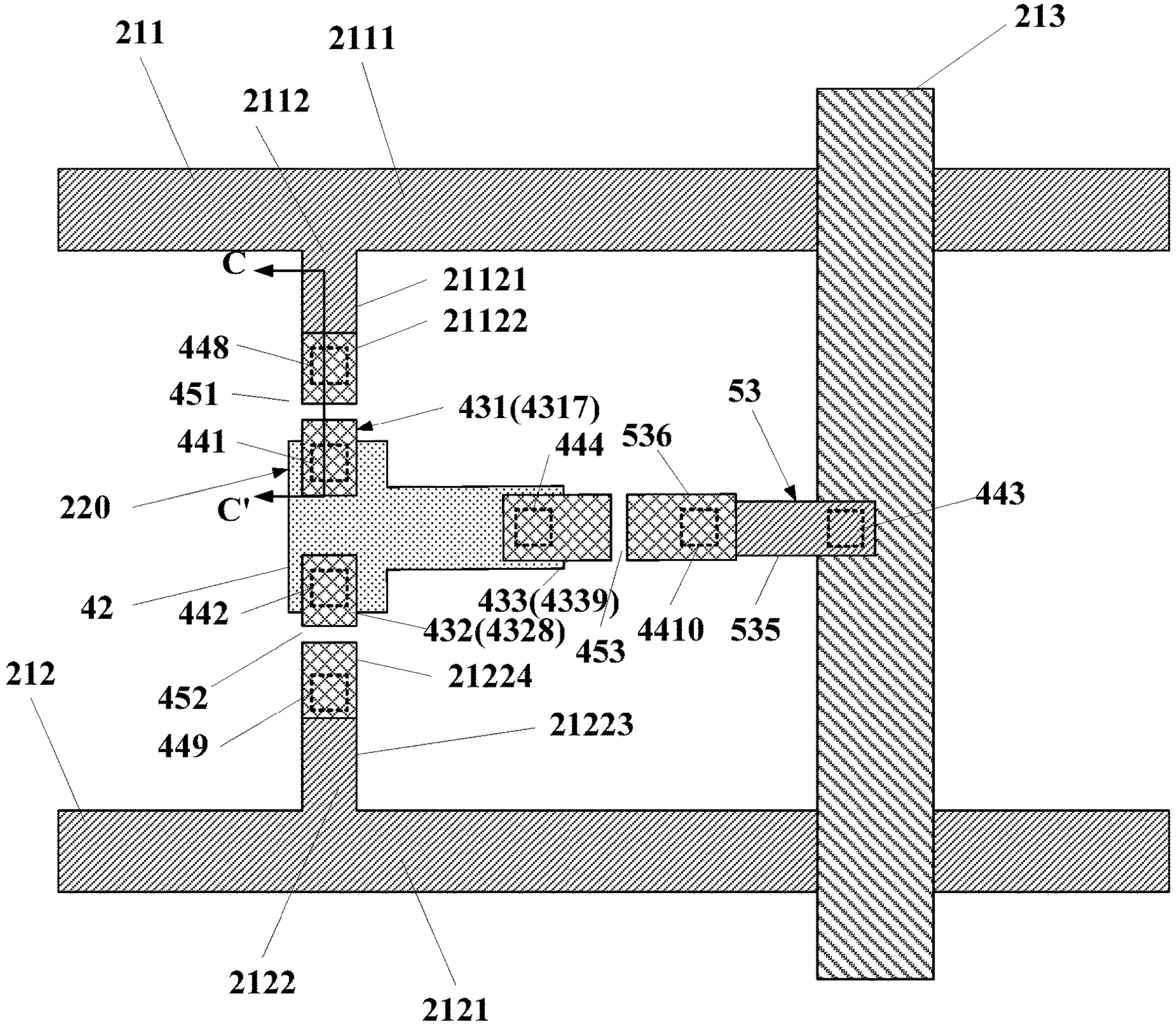
FIG. 11 is a schematic layout view showing a semiconductor structure of a display substrate according to another embodiment of the present disclosure.

FIG. 11 is a schematic layout view showing a semiconductor structure of a display substrate according to another embodiment of the present disclosure. FIG. 11 shows structures of the first protrusion 2112, the second protrusion 2122, the first connecting portion 431 and the second connecting portion 432 according to other embodiments of the present disclosure.

As shown in FIG. 11, the first protrusion 2112 comprises: a first sub-protrusion 21121 connected to a main body portion 2111 of the first signal line 211, and a second sub-protrusion 21122 electrically connected to the first sub-protrusion 21121 through an eighth conductive via hole 448. The second sub-protrusion 21122 is in a same layer as the source or the drain. The first sub-protrusion 21121 is integrally formed with the main body portion 2111 of the first signal line 211.

As shown in FIG. 11, the first connecting portion 431 comprises a seventh portion 4317 electrically connected to the first end of the semiconductor layer 42 through the first conductive via hole 441. The seventh portion 4317 is spaced apart from the second sub-protrusion 21122 by the first gap 451. The seventh portion 4317 is in a same layer as the source or the drain.

As shown in FIG. 11, the second protrusion 2122 comprises: a third sub-protrusion 21223 connected to a main body portion 2121 of the second signal line 212, and a fourth sub-protrusion 21224 electrically connected to the third sub-protrusion 21223 through a ninth conductive via hole 449. The fourth sub-protrusion 21224 is in a same layer as the source or the drain. The third sub-protrusion 21223 is integrally formed with the main body portion 2121 of the second signal line 212.

As shown in FIG. 11, the second connecting portion 432 comprises an eighth portion 4328 electrically connected to the second end of the semiconductor layer 42 through the second conductive via hole 442. The eighth portion 4328 is spaced apart from the fourth sub-protrusion 21224 by the second gap 452. The eighth portion 21224 is in a same layer as the source or the drain.

The structures of the first protrusion, the second protrusion, the first connecting portion and the second connecting portion according to other embodiments are implemented above.

The above-described semiconductor structure can be formed during the process of forming the active layer, the gate, the source and the drain of the thin film transistor, thereby achieving compatibility with the manufacturing process of the thin film transistor and facilitating the manufacture of the display substrate.

FIG. 11 also shows structures of the third protrusion 53 and the third connecting portion 433 according to other embodiments of the present disclosure.

As shown in FIG. 11, the third protrusion 53 comprises: a fifth sub-protrusion 535 electrically connected to the third signal line 213 through the third conductive via hole 443, and a sixth sub-protrusion 536 electrically connected to the fifth sub-protrusion 535 through a tenth conductive via hole 4410. The fifth sub-protrusion 535 is in a same layer as the first signal line 211 or the second signal line 212. The sixth sub-protrusion 536 is in a same layer as the source or the drain.

As shown in FIG. 11, the third connecting portion 433 comprises a ninth portion 4339 electrically connected to the third end of the semiconductor layer 42 through the fourth conductive via hole 444. The ninth portion 4339 is spaced apart from the sixth sub-protrusion 536 by the third gap 453. The ninth portion 4339 is in a same layer as the source or the drain.

The structures of the third protrusion and the third connecting portion according to other embodiments are implemented above.

The above-described semiconductor structure can be formed during the process of forming the active layer, the gate, the source and the drain of the thin film transistor, thereby achieving compatibility with the manufacturing process of the thin film transistor and facilitating the manufacture of the display substrate.

It is to be noted that although FIG. 11 shows that the protrusion comprises three protrusions, i.e., the first protrusion, the second protrusion and the third protrusion, and the connecting portion comprises three connecting portions, i.e., the first connecting portion, the second connecting portion and the third connecting portion, the scope of the present disclosure is not limited thereto. For example, the protrusion comprises at least one of the first protrusion, the second protrusion or the third protrusion, and correspondingly, the connecting portion comprises at least one of the first connecting portion, the second connecting portion or the third connecting portion.

Figure 12:
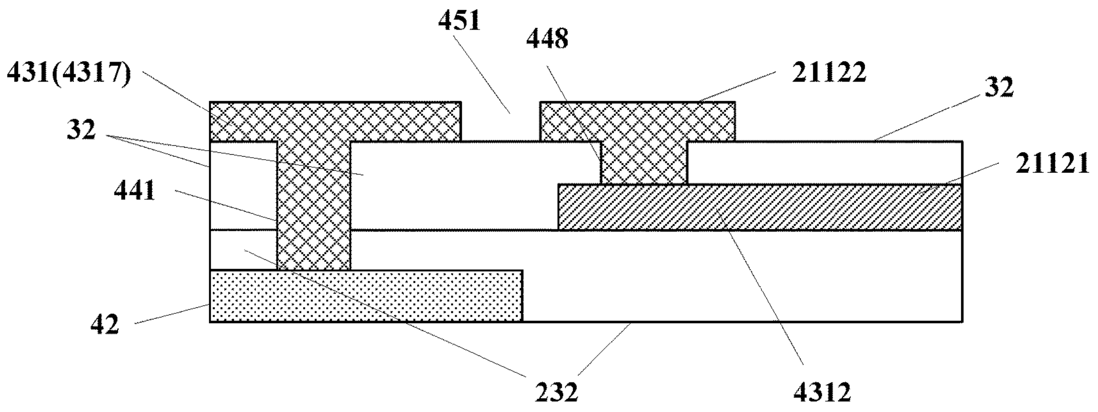
FIG. 12 is a schematic cross-sectional view showing a structure of a semiconductor structure taken along a line C-C' of FIG. 11 according to one embodiment of the present disclosure.

FIG. 12 is a schematic cross-sectional view showing a structure of a semiconductor structure taken along a line C-C' of FIG. 11 according to one embodiment of the present disclosure.

As shown in FIG. 12, the first insulating layer 232 covers at least a part of the semiconductor layer 42. The second insulating layer 32 covers a part of the first insulating layer 232. The first conductive via hole 441 passes through the first insulating layer 232 and the second insulating layer 32, and the eighth conductive via hole 448 passes through the second insulating layer 32. The seventh portion 4317 of the first connecting portion 431 and the second sub-protrusion 21122 of the first protrusion 2112 are on the second insulating layer 32. Correspondingly, the first gap 451 is also on the second insulating layer 32.

FIG. 12 exemplarily shows the cross-sectional structures of the first conductive via hole 441 and the eighth conductive via hole 448, while a structure of the second conductive via hole 442 in FIG. 11 is similar to a structure of the first conductive via hole 441, and a structure of the ninth conductive via hole 449 is similar to a structure of the eighth conductive via hole 448. A cross-sectional structure of the fourth conductive via hole 444 in FIG. 11 is similar to the structure of the first conductive via hole 441 in FIG. 12.

Figure 13:
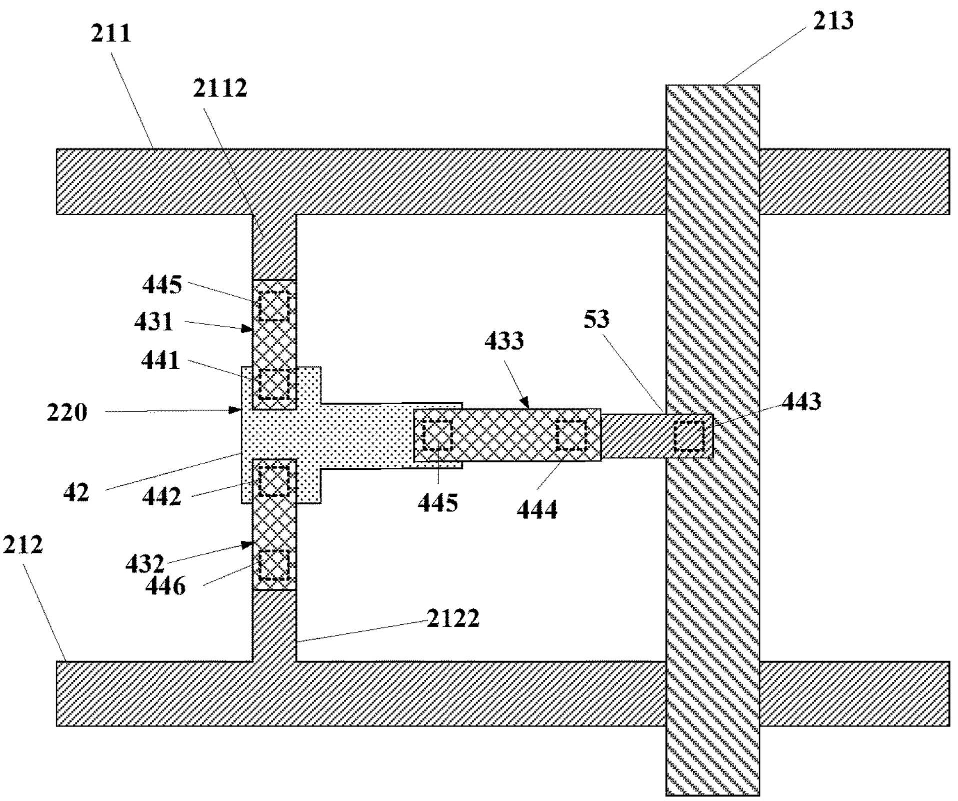
FIG. 13 is a schematic layout view showing a semiconductor structure of a display substrate according to another embodiment of the present disclosure.

FIG. 13 is a schematic layout view showing a semiconductor structure of a display substrate according to another embodiment of the present disclosure.

In the structure shown in FIG. 13, the semiconductor layer 42 of the semiconductor structure is electrically connected to the signal line through the connecting portion. The semiconductor layer 42 is connected to the first protrusion 2112 of the first signal line 211 through the first connecting portion 431, the semiconductor layer 42 is connected to the second protrusion 2122 of the second signal line 212 through the second connecting portion 432, and the semiconductor layer 42 is connected to the third protrusion 53 through the third connecting portion 433, wherein the third protrusion 53 is electrically connected to the third signal line 213.

Similar to the above, the structure shown in FIG. 13 is a semiconductor structure formed during the manufacturing process of the display substrate, and the first signal line, the second signal line or the third signal line can implement electrostatic discharge by the semiconductor structure shown in FIG. 13. After the electrostatic discharge is implemented, the structure shown in FIG. 9 is formed in a case where the protrusion is disconnected by etching. Alternatively, after the electrostatic discharge is implemented, the structure shown in FIG. 11 is formed in a case where the connecting portion is disconnected by etching. In the structure shown in FIG. 9 or FIG. 11, electrostatic discharge can be achieved by point discharge, that is, electrostatic charges on the first signal line, the second signal line or the third signal line is discharged, thereby preventing accumulation of charges on the signal line.

Figure 14A:
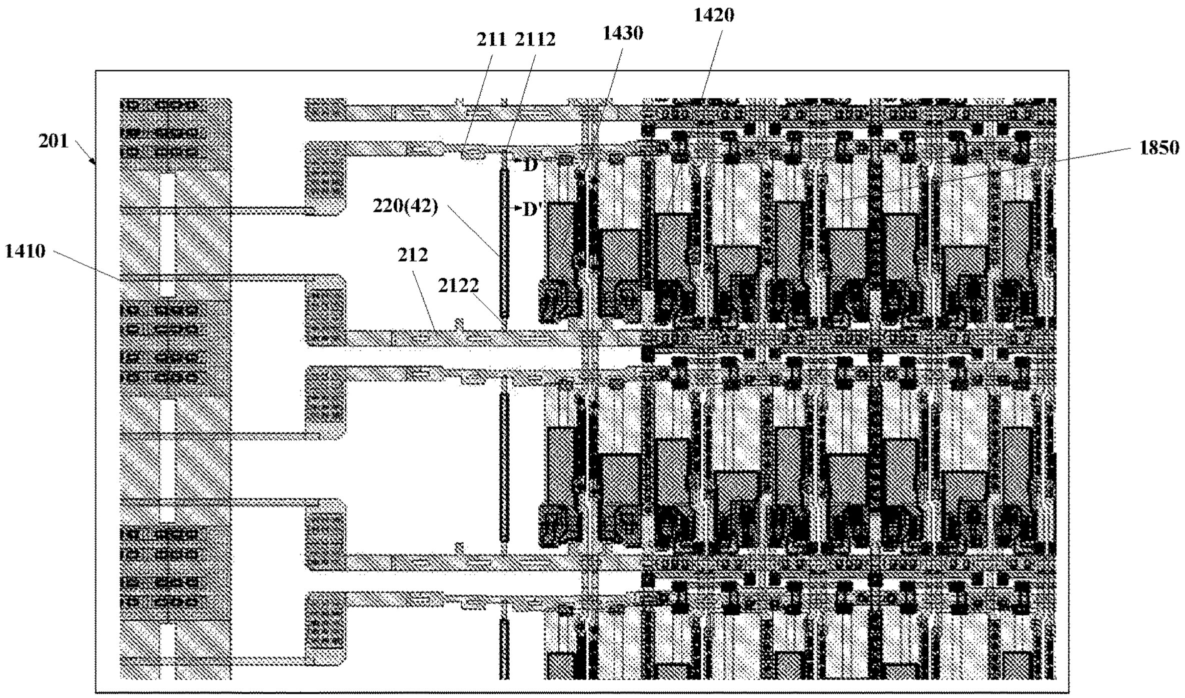
FIG. 14A is a schematic layout view showing a display substrate according to an embodiment of the present disclosure.
Figure 14B:
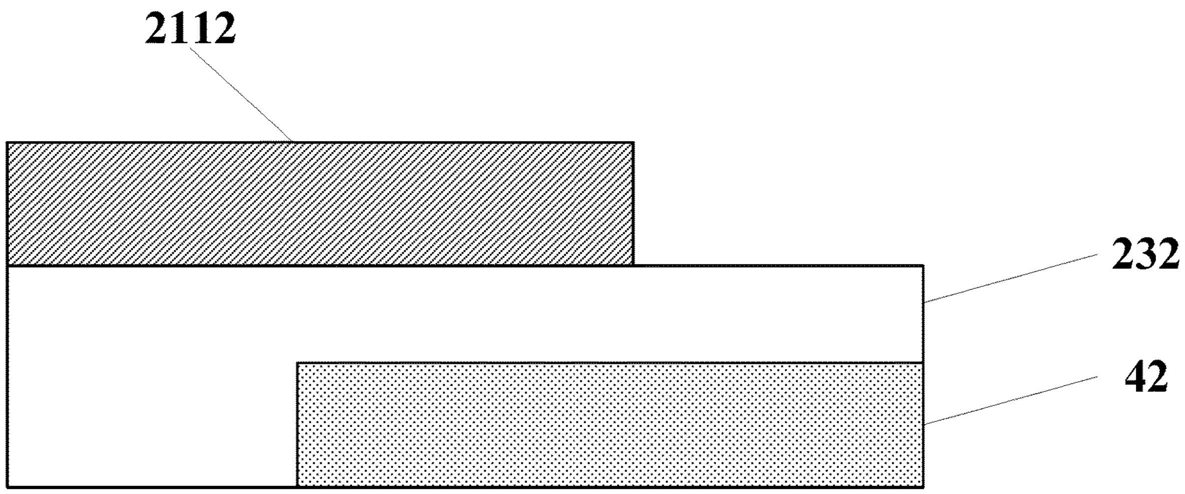
FIG. 14B is a schematic cross-sectional view showing a structure of a display substrate taken along a line D-D' of FIG. 14A according to an embodiment of the present disclosure.

FIG. 14A is a schematic layout view showing a display substrate according to an embodiment of the present disclosure. FIG. 14B is a schematic cross-sectional view showing a structure of a display substrate taken along a line D-D' of FIG. 14A according to an embodiment of the present disclosure.

As shown in FIG. 14A, the display substrate comprises a base substrate 201, a signal line and a semiconductor structure 220. For example, the signal line comprises a first signal line 211 and a second signal line 212. For example, the semiconductor structure 220 is spaced apart from the first signal line 211, and the semiconductor structure 220 is spaced apart from the second signal line 212. For example, as shown in FIG. 14B, a semiconductor layer 42 of the semiconductor structure 220 is spaced apart from a protrusion 2112 of the first signal line 211 by a first insulating layer 232. Similarly, the semiconductor layer 42 of the semiconductor structure 220 is also spaced apart from a protrusion 2122 of the second signal line 212 by the first insulating layer 232. That is, in the embodiment, the semiconductor layer of the semiconductor structure is spaced apart from the protrusion of the signal line by the first insulating layer.

In some embodiments, the signal line comprises a protrusion, wherein an orthographic projection of the protrusion on the base substrate at least partially overlaps with an orthographic projection of the semiconductor layer on the base substrate. For example, as shown in FIGS. 14A and 14B, an orthographic projection of the semiconductor layer 42 of the semiconductor structure 220 on the base substrate at least partially overlaps with an orthographic projection of the protrusion 2112 of the first signal line 211 on the base substrate. For another example, the orthographic projection of the semiconductor layer 42 of the semiconductor structure 220 on the base substrate at least partially overlaps with an orthographic projection of the protrusion 2122 of the second signal line 212 on the base substrate.

As shown in FIG. 14A, the display substrate further comprises: a gate driving circuit 1410 and a pixel structure 1420 both on the base substrate 201. The gate driving circuit 1410 and the pixel structure 1420 each are electrically connected to the signal line (for example, the first signal line 211 and the second signal line 212). Here, the pixel structure comprises the thin film transistor as described above. The semiconductor structure 220 is between the gate driving circuit 1410 and the pixel structure 1420. For example, as shown in FIG. 14A, the shape of the semiconductor layer of the semiconductor structure 220 is rectilinear.

In some embodiments, as shown in FIG. 14A, the display substrate further comprises a dummy pixel structure 1430 between the gate driving circuit 1410 and the pixel structure 1420. The dummy pixel structure 1430 is not electrically connected to the signal line (for example, the first signal line 211 and the second signal line 212). Therefore, the dummy pixel structure 1430 cannot achieve light-emitting and display. The dummy pixel structure is convenient to achieving the consistency of some processes when the display substrate is formed, for example, it is possible to achieve the consistency of an etching process.

As shown in FIG. 14A, the pixel structure 1420 is closer to the dummy pixel structure 1430 than the gate driving circuit 1410. The semiconductor structure 220 is between the gate driving circuit 1410 and the dummy pixel structure 1430.

The semiconductor structure shown in FIG. 14A can achieve charge discharge in the manufacturing process (for example, dry etching) for a display substrate, and then the semiconductor structure 220 can be spaced apart from the first signal line 211 and the semiconductor structure 220 can be spaced apart from the second signal line 212 by an etching process.

Figure 15:
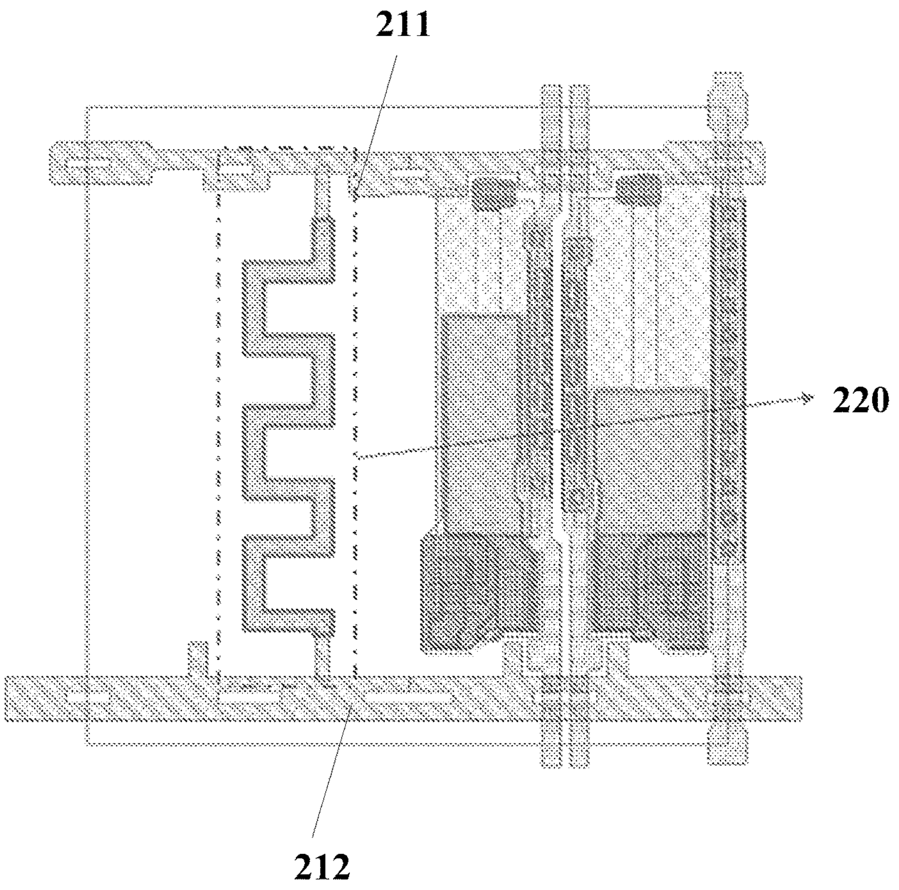
FIG. 15 is a schematic layout view showing a display substrate according to another embodiment of the present disclosure.

FIG. 15 is a schematic layout view showing a display substrate according to another embodiment of the present disclosure.

As shown in FIG. 15, the shape of the semiconductor layer of the semiconductor structure 220 is curved. The semiconductor layer of the semiconductor structure 220 is designed to be curved to increase the trace length of the semiconductor layer, so that more charges on the signal line are discharged, thereby producing a better electrostatic discharge effect.

The semiconductor structure 220 is spaced apart from the first signal line 211, and the semiconductor structure 220 is spaced apart from the second signal line 212. Similar to the structures of FIGS. 14A and 14B, the signal line comprises a protrusion, and an orthographic projection of the protrusion on the base substrate at least partially overlaps with an orthographic projection of the semiconductor layer on the base substrate. For example, as shown in FIG. 15, an orthographic projection of the semiconductor layer of the semiconductor structure 220 on the base substrate at least partially overlaps with an orthographic projection of the protrusion of the first signal line 211 on the base substrate, and the orthographic projection of the semiconductor layer of the semiconductor structure 220 on the base substrate at least partially overlaps with an orthographic projection of the protrusion of the second signal line 212 on the base substrate. Similar to the structures of FIGS. 14A and 14B, the semiconductor layer of the semiconductor structure is spaced apart from the protrusion of the signal line by the first insulating layer.

To sum up, in some embodiments of the present disclosure, the shape of the semiconductor layer of the semiconductor structure is rectilinear, T-shaped or curved. Of course, those skilled in the art can understand that the shape of the semiconductor layer of the semiconductor structure may also be in other shapes, and the scope of the present disclosure is not limited to the specific shape of the semiconductor layer.

Figure 16:
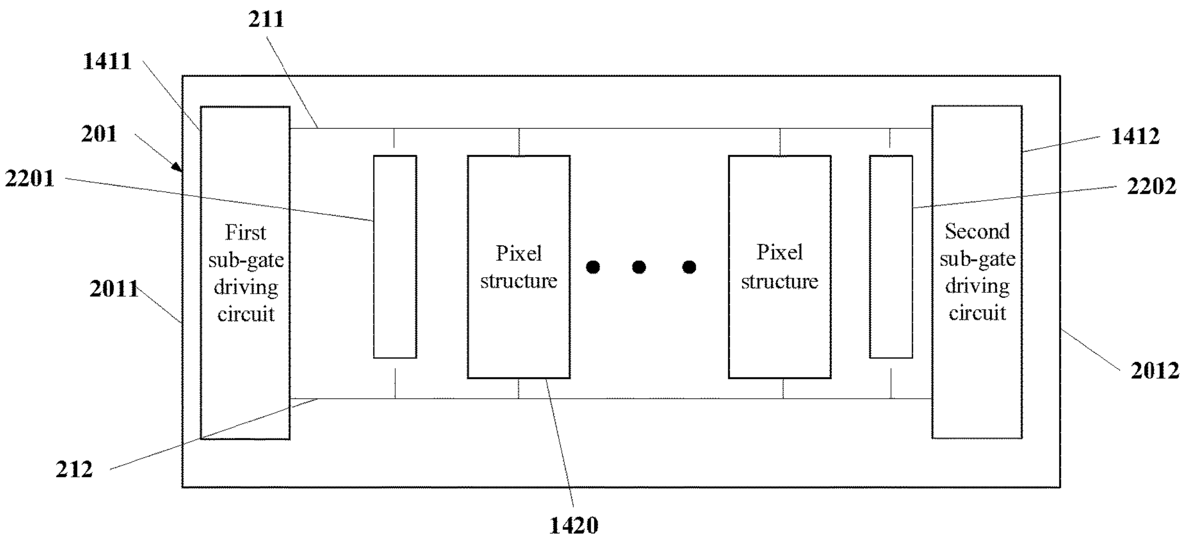
FIG. 16 is a schematic structural view showing a display substrate according to another embodiment of the present disclosure.

FIG. 16 is a schematic structural view showing a display substrate according to another embodiment of the present disclosure.

As shown in FIG. 16, the display substrate comprises: a base substrate 201, a signal line (for example, a first signal line 211 and a second signal line 212), a semiconductor structure, a gate driving circuit and a pixel structure 1420.

In some embodiments, as shown in FIG. 16, the gate driving circuit comprises: a first sub-gate driving circuit 1411 close to a first edge 2011 of the base substrate 201, and a second sub-gate driving circuit 1412 close to a second edge 2012 of the base substrate 201. The second edge 2012 is opposite to the first edge 2011.

The semiconductor structure comprises: a first semiconductor structure 2201 between the first sub-gate driving circuit 1411 and the pixel structure 1420, and a second semiconductor structure 2202 between the second sub-gate driving circuit 1412 and the pixel structure 1420. Two semiconductor structures are provided so that a better electrostatic discharge effect can be achieved.

For example, as shown in FIG. 16, the signal line comprises a first signal line 211 and a second signal line 212 adjacent to the first signal line 211. The first semiconductor structure 2201 and the second semiconductor structure 2202 are between the first signal line 211 and the second signal line 212.

As mentioned above, in the case where the semiconductor structure is electrically connected to the signal line, the effect of annular discharge is easily achieved; and in the case where the semiconductor structure is disconnected from the signal line, electrostatic discharge can be achieved by point discharge.

In some embodiments of the present disclosure, a display device is also provided. The display device comprises the display substrate as described above. For example, the display device may be any product or member having a display function, such as a display panel, a mobile phone, a tablet computer, a television, a display, a notebook computer, a digital photo frame or a navigator.

Figure 17:
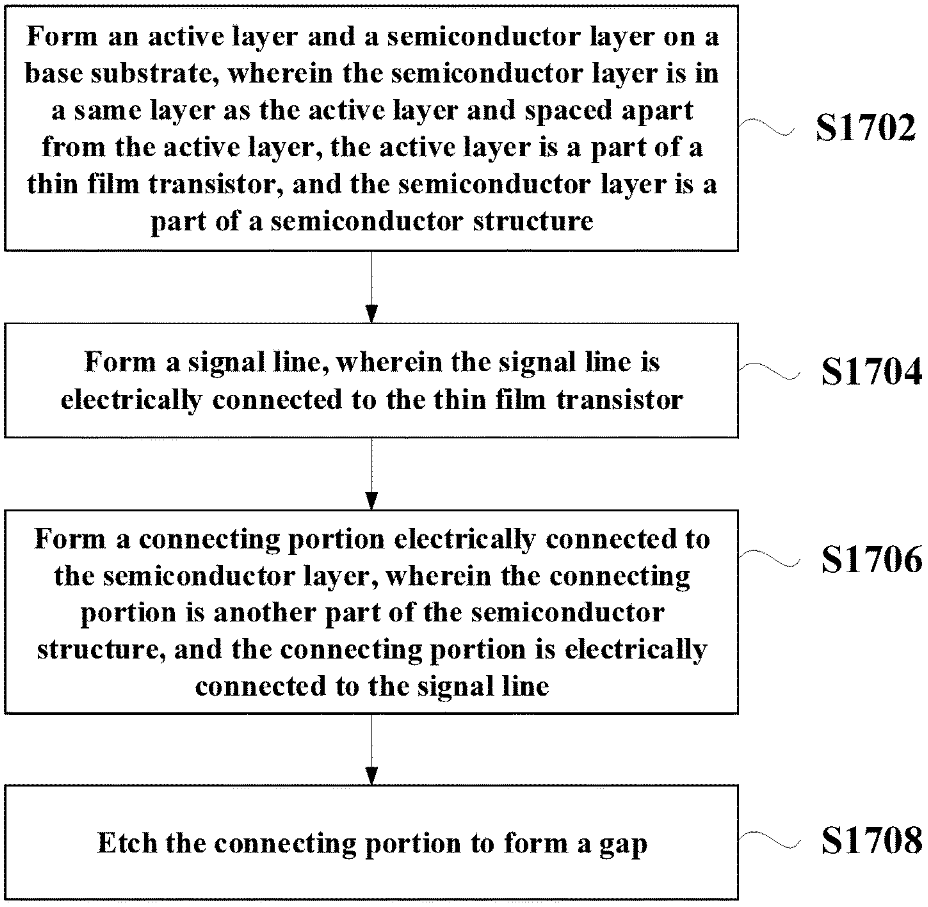
FIG. 17 is a flowchart showing a manufacturing method for a display substrate according to an embodiment of the present disclosure.

FIG. 17 is a flowchart showing a manufacturing method for a display substrate according to an embodiment of the present disclosure. As shown in FIG. 17, the manufacturing method comprises steps S1702 to S1708.

In step S1702, an active layer and a semiconductor layer are formed on a base substrate, wherein the semiconductor layer is in a same layer as the active layer and spaced apart from the active layer, the active layer is a part of a thin film transistor, and the semiconductor layer is a part of a semiconductor structure.

In step S1704, a signal line is formed, wherein the signal line is electrically connected to the thin film transistor.

In step S1706, a connecting portion electrically connected to the semiconductor layer is formed, wherein the connecting portion is another part of the semiconductor structure, and the connecting portion is electrically connected to the signal line.

In step S1708, the connecting portion is etched to form a gap.

So far, a manufacturing method for a display substrate according to some embodiments of the present disclosure is provided. In the manufacturing process, during the process of forming the signal line and the connecting portion of the semiconductor structure, the connecting portion is electrically connected to the signal line, and the connecting portion is electrically connected to the semiconductor layer, so that electrostatic charges that might be accumulated on the signal line are discharged by means of electrostatic discharge, for example, into the semiconductor layer; the connecting portion is then etched to form a gap, so that the connecting portion of the semiconductor structure is disconnected from the signal line by etching without affecting normal operation of the display substrate. In addition, although the connecting portion of the semiconductor structure is disconnected from the signal line by etching, during the process of the normal operation of the display substrate, electrostatic discharge can still be achieved by point discharge, thereby preventing accumulation of charges on the signal line and improving the reliability of the display substrate.

FIGS. 18A to 18H are schematic layout views showing structures of several stages during a manufacturing process for a display substrate according to some embodiments of the present disclosure.

Hereinafter, a manufacturing method for a display substrate according to some embodiments of the present disclosure will be described in detail in conjunction with FIGS. 18A to 18H and FIG. 14A.

Figure 18A:
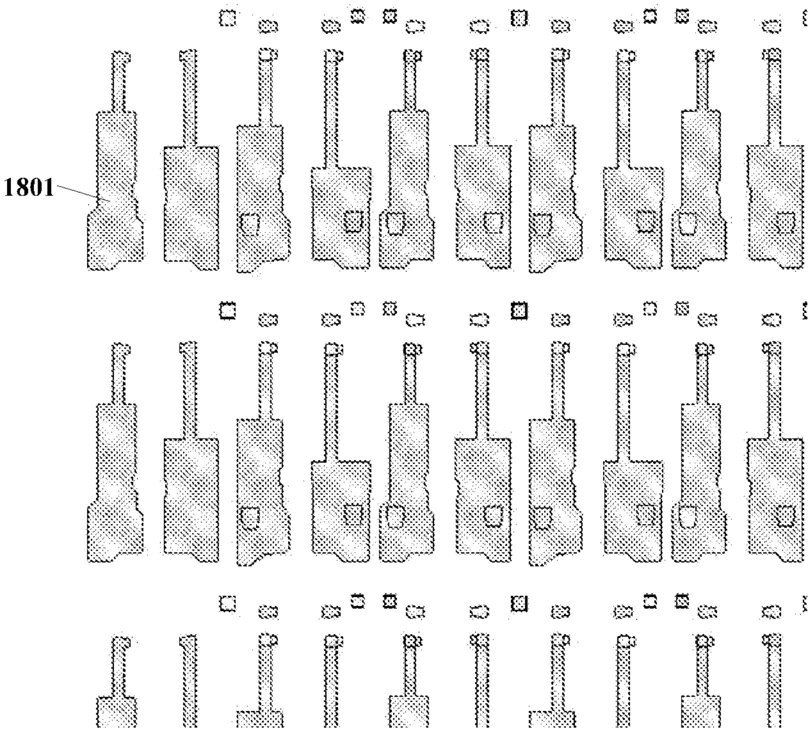
FIGS. 18A to 18H are schematic layout views showing structures of several stages during a manufacturing process for a display substrate according to some embodiments of the present disclosure.

First, as shown in FIG. 18A, for example, an electrode plate layer 1801 serving as an electrode plate of a capacitor is formed on a base substrate (not shown in FIG. 18A). For example, a material of the electrode plate layer 1801 comprises a transparent conductive material. For example, the transparent conductive material comprises ITO (Indium Tin Oxide) or the like.

Figure 18B:
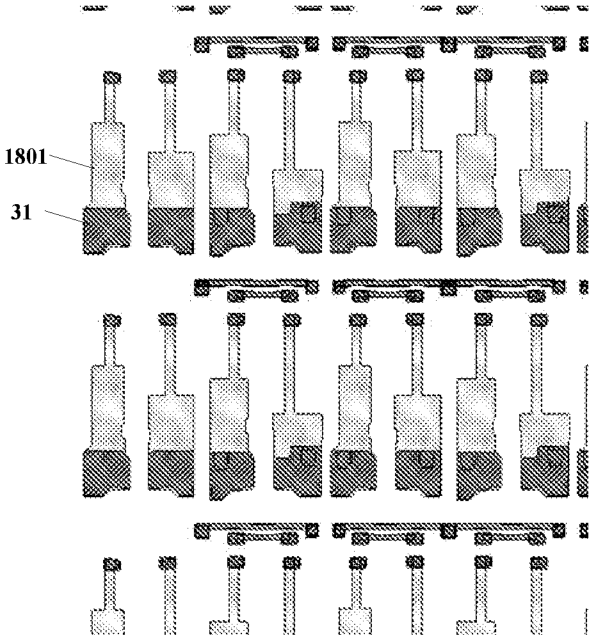

Next, as shown in FIG. 18B, a light shielding layer 31 on the electrode plate layer 1801 is formed by a deposition process and a patterning process.

Figure 18C:
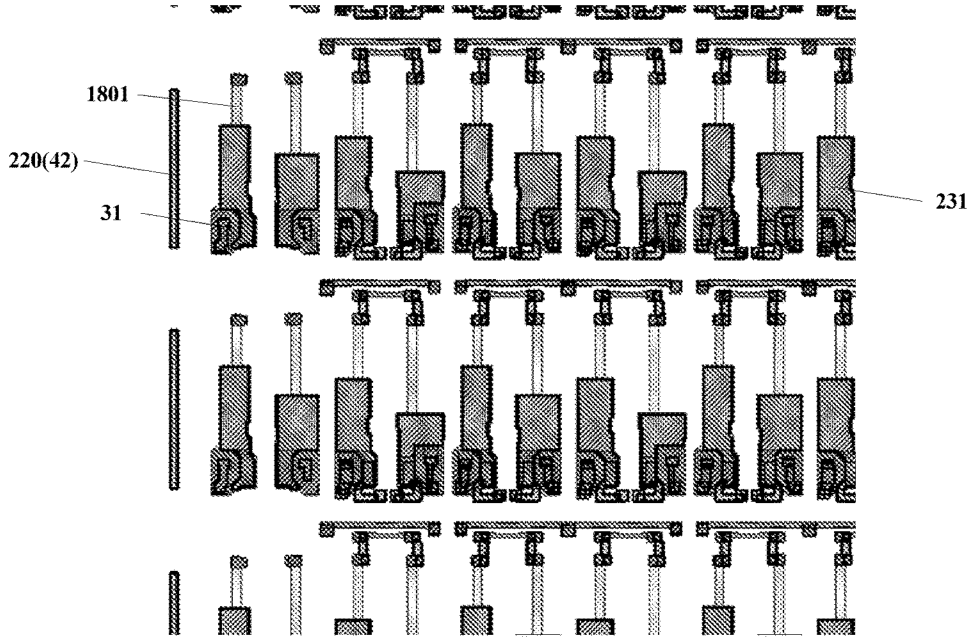

Next, as shown in FIG. 18C, an active layer 231 and a semiconductor layer 42 of a semiconductor structure 220 are formed by the same patterning process. Of course, a buffer layer is formed between the active layer 231 and the light shielding layer 31, but not shown in FIG. 18C.

Figure 18D:
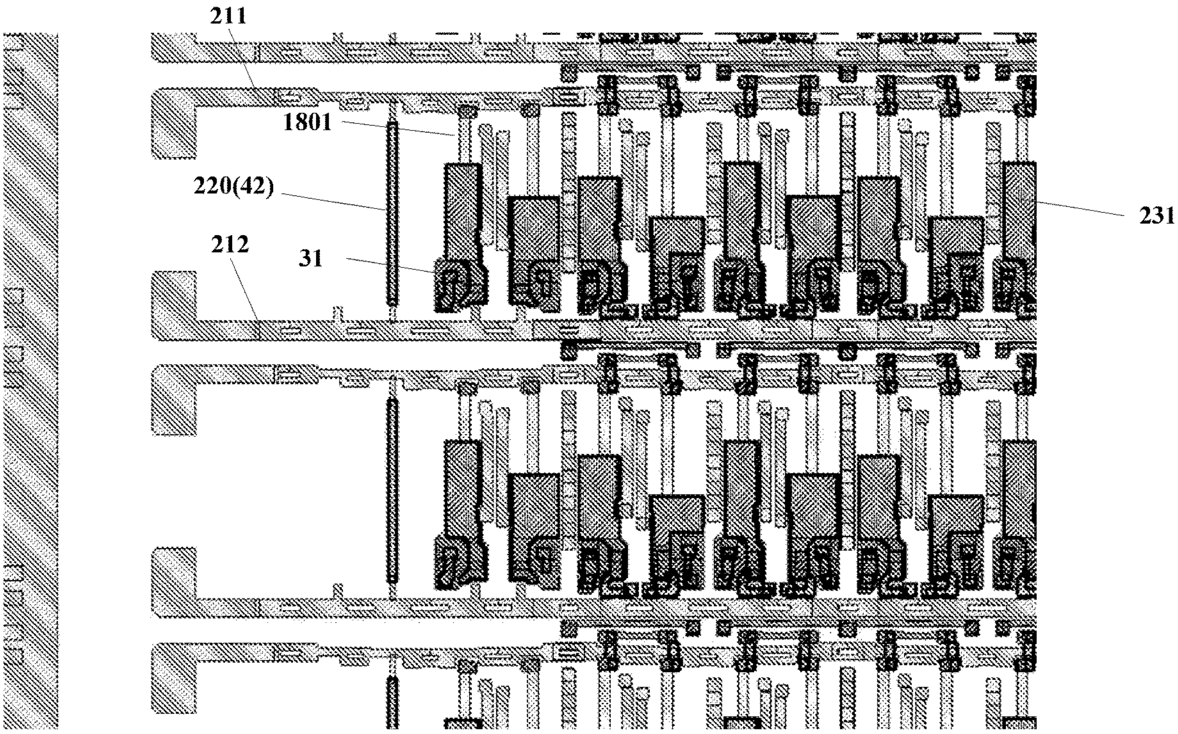

Next, as shown in FIG. 18D, a gate layer, a first signal line 211 and a second signal line 212 are formed by the same patterning process. Of course, a first insulating layer 232 is formed between the gate layer and the active layer 231, but not shown in FIG. 18D.

Figure 18E:
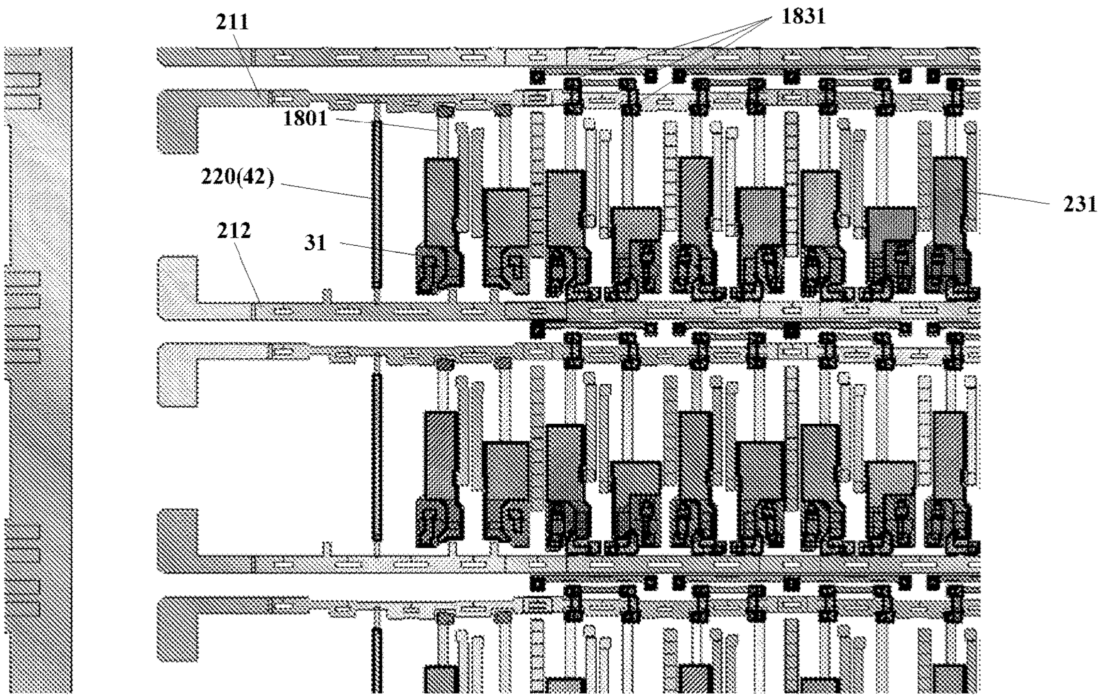

Next, as shown in FIG. 18E, a via hole 1831 between the active layer 231 and the light shielding layer 31 is formed.

Figure 18F:
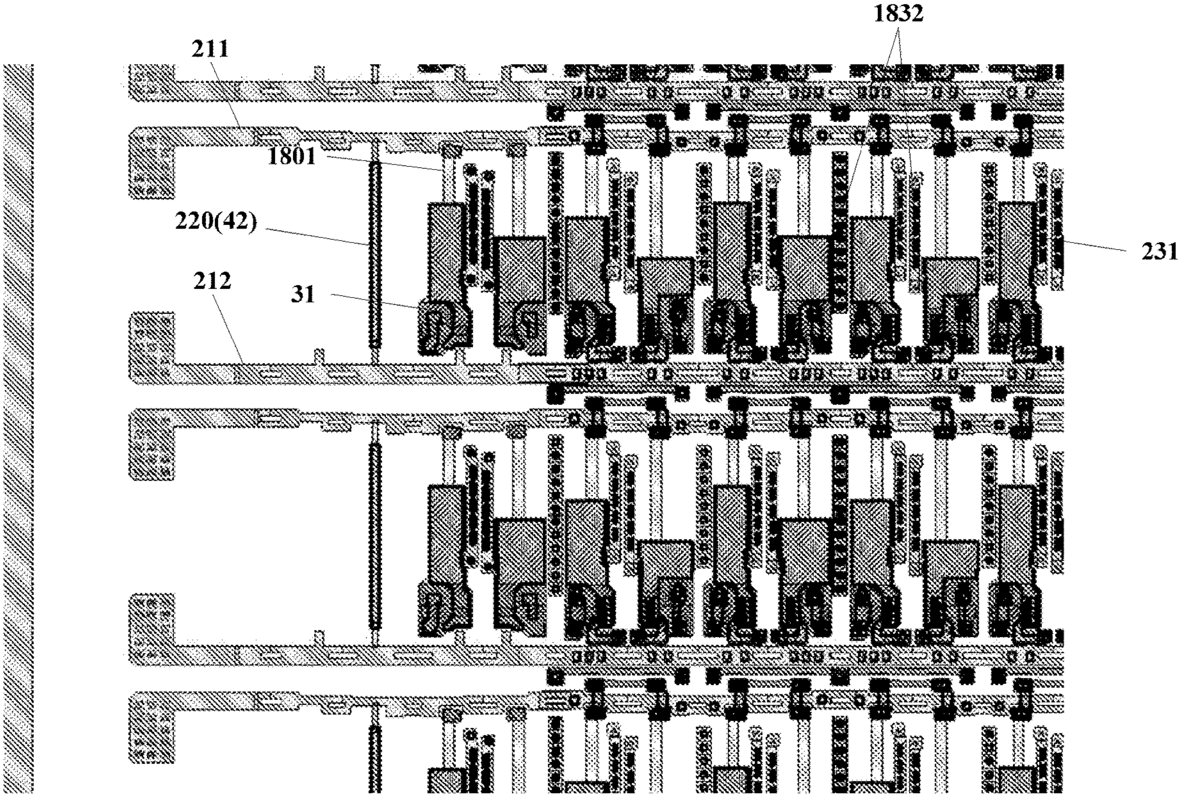

Next, a second insulating layer 32 is formed, the second insulating layer 32 serving as an interlayer dielectric layer. FIG. 18F shows a via hole 1832 passing through the second insulating layer 32, which indicates that the second insulating layer 32 has been formed.

Figure 18G:
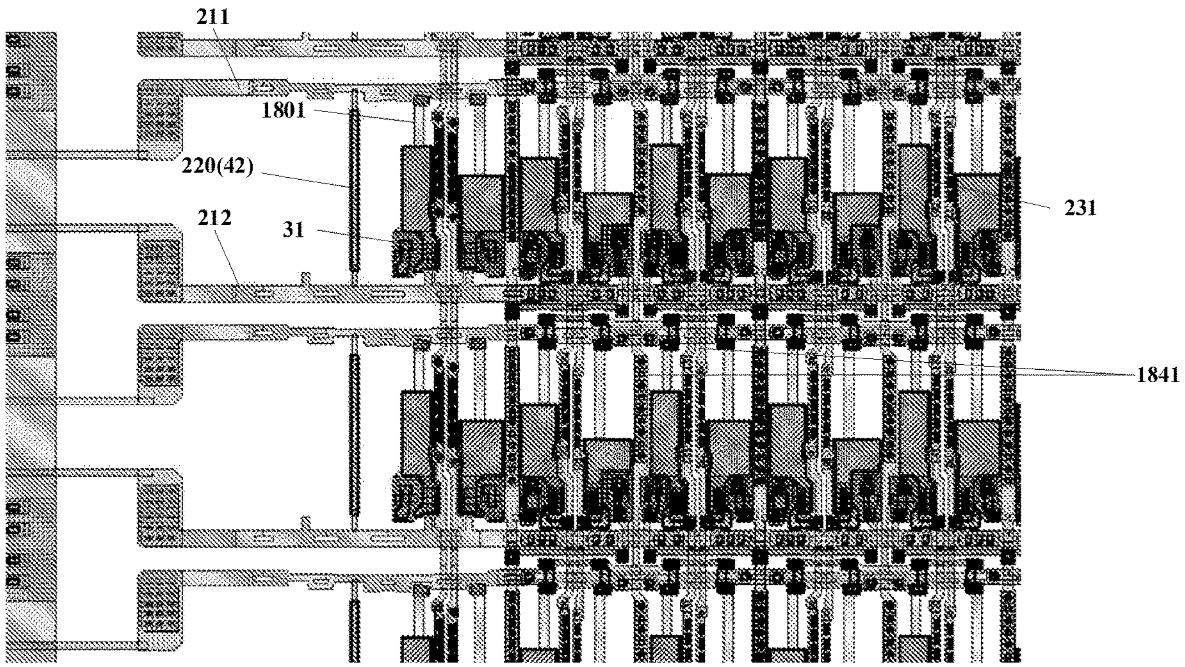

Next, as shown in FIG. 18G, a metal layer 1841 where a source or a drain is located is formed.

Figure 18H:
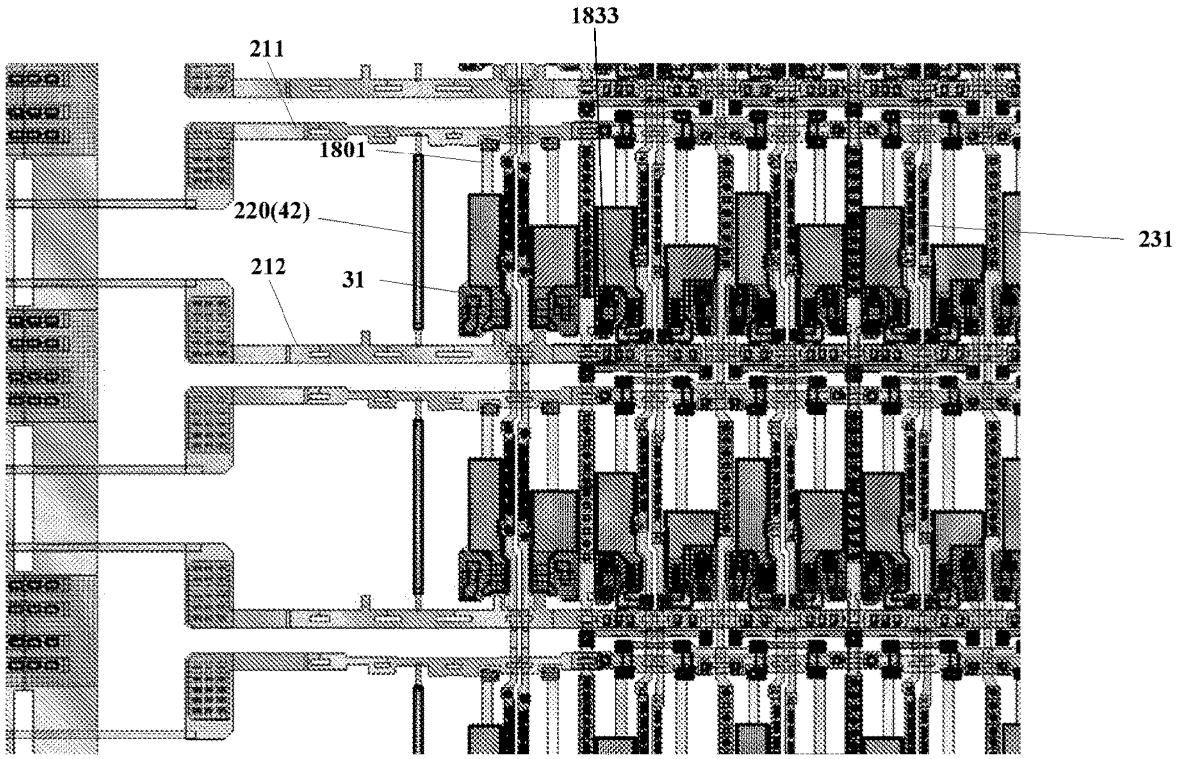

Next, a passivation layer is formed. FIG. 18H shows a via hole 1833 passing through the passivation layer, which indicates that the passivation layer has been formed.

Next, as shown in FIG. 14A, a conductive layer 1850 is formed. For example, the conductive layer 1850 is an ITO layer.

So far, a manufacturing method for a display substrate according to some embodiments of the present disclosure is provided. The semiconductor structure can product the effect of electrostatic discharge.

In other embodiments, the manufacturing method further comprises: disconnecting the connecting portion of the semiconductor structure from the signal line by etching, so as not to affect normal operation of the display substrate. In addition, although the connecting portion of the semiconductor structure is disconnected from the signal line, during the process of the normal operation of the display substrate, electrostatic discharge can still be achieved by point discharge, thereby preventing accumulation of charges on the signal line and improving the reliability of the display substrate.

Of course, those skilled in the art can understand that the manufacturing method for the display substrate can also comprise other known steps, which will not be described in detail here.

Figure 19:
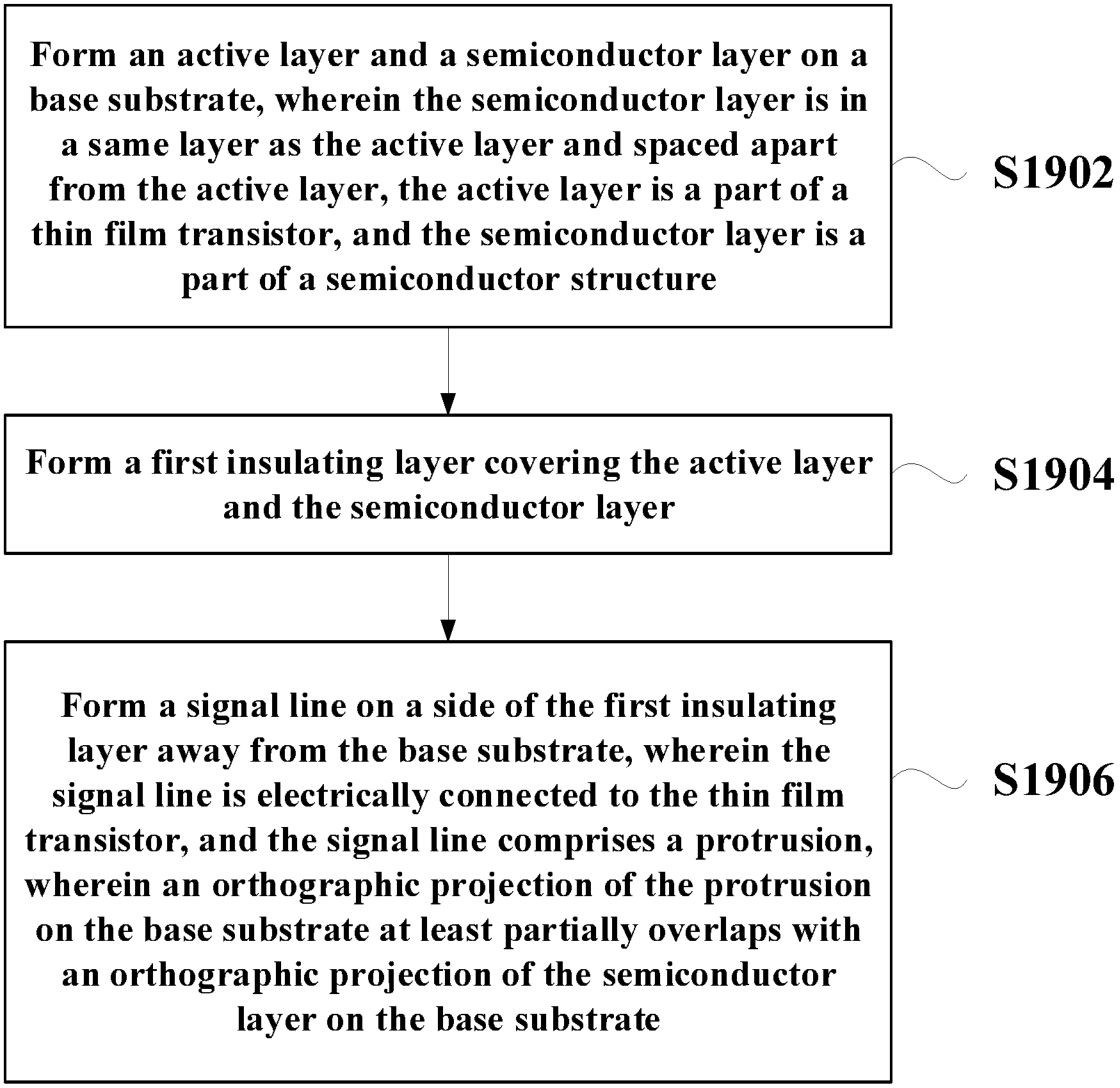
FIG. 19 is a flowchart showing a manufacturing method for a display substrate according to another embodiment of the present disclosure.

FIG. 19 is a flowchart showing a manufacturing method for a display substrate according to another embodiment of the present disclosure. As shown in FIG. 19, the manufacturing method comprises steps S1902 to S1906.

In step S1902, an active layer and a semiconductor layer are formed on a base substrate, wherein the semiconductor layer is in a same layer as the active layer and spaced apart from the active layer, the active layer is a part of a thin film transistor, and the semiconductor layer is a part of a semiconductor structure.

In step S1904, a first insulating layer covering the active layer and the semiconductor layer is formed.

For example, as shown in FIG. 14B, the first insulating layer 232 covering the active layer 231 (as shown in FIG. 3) and the semiconductor layer 42 is formed by a deposition process.

In step S1906, a signal line is formed on a side of the first insulating layer away from the base substrate, wherein the signal line is electrically connected to the thin film transistor, the signal line comprises a protrusion, wherein an orthographic projection of the protrusion on the base substrate at least partially overlaps with an orthographic projection of the semiconductor layer on the base substrate.

For example, as shown in FIGS. 14A and 14B, a signal line, such as a first signal line 211 and a second signal line 212, is formed on a side of the first insulating layer 232 away from the base substrate. For example, an orthographic projection of the first protrusion 2112 of the first signal line 211 on the base substrate at least partially overlaps with an orthographic projection of the semiconductor layer 42 on the base substrate. For another example, an orthographic projection of the second protrusion 2122 of the second signal line 212 on the base substrate at least partially overlaps with the orthographic projection of the semiconductor layer 42 on the base substrate.

So far, a manufacturing method for a display substrate according to other embodiments of the present disclosure is provided. For example, the display substrate as shown in FIGS. 14A and 14B can be formed by the manufacturing method.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration but not for limiting the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A display substrate, comprising:

a base substrate;

a signal line on the base substrate;

a thin film transistor on the base substrate, wherein the thin film transistor is electrically connected to the signal line, and the thin film transistor comprises: an active layer, a first insulating layer on a side of the active layer away from the base substrate, a gate on a side of the first insulating layer away from the base substrate, and a source and a drain each electrically connected to the active layer;

a semiconductor structure comprising a semiconductor layer, wherein the semiconductor layer is in a same layer as the active layer, and the semiconductor layer is spaced apart from the signal line; and a gate driving circuit and a pixel structure both on the base substrate, wherein the gate driving circuit and the pixel structure each are electrically connected to the signal line, and the pixel structure comprises the thin film transistor;

wherein the semiconductor structure is between the gate driving circuit and the pixel structure.

2. The display substrate according to claim 1, wherein the semiconductor structure further comprises a connecting portion electrically connected to the semiconductor layer, the connecting portion being spaced apart from the signal line by a gap.

3. The display substrate according to claim 1, wherein the signal line comprises a protrusion, wherein an orthographic projection of the protrusion on the base substrate at least partially overlaps with an orthographic projection of the semiconductor layer on the base substrate.

4. The display substrate according to claim 2, wherein:

the signal line comprises a first signal line and a second signal line; and the connecting portion comprises a first connecting portion and a second connecting portion, wherein the first connecting portion is electrically connected to a first end of the semiconductor layer through a first conductive via hole, the first connecting portion is spaced apart from the first signal line by a first gap, the second connecting portion is electrically connected to a second end of the semiconductor layer through a second conductive via hole, and the second connecting portion is spaced apart from the second signal line by a second gap.

5. The display substrate according to claim 4, wherein:

the first signal line is a first gate line, and the second signal line is a second gate line; and the first connecting portion is in a same layer as the first gate line, and the second connecting portion is in a same layer as the second gate line.

6. The display substrate according to claim 4, wherein the signal line comprises a protrusion, the protrusion being spaced apart from the connecting portion by the gap.

7. The display substrate according to claim 6, wherein:

the first signal line comprises a first protrusion, wherein the first protrusion is spaced apart from the first connecting portion by the first gap; and the second signal line comprises a second protrusion, wherein the second protrusion is spaced apart from the second connecting portion by the second gap.

8. The display substrate according to claim 6, wherein:

the signal line further comprises a third signal line, the third signal line being electrically connected to a third protrusion through a third conductive via hole; and the connecting portion further comprises a third connecting portion, wherein the third connecting portion is electrically connected to a third end of the semiconductor layer through a fourth conductive via hole and the third connecting portion is spaced apart from the third protrusion by a third gap.

9. The display substrate according to claim 8, wherein:

the first signal line is a first gate line, the second signal line is a second gate line, and the third signal line is a power supply voltage line, a common ground line, a data line or a sensing line; and the third connecting portion is in a same layer as the first gate line or the second gate line, and in a same layer as the third protrusion.

10. The display substrate according to claim 4, wherein:

the first connecting portion comprises: a first portion electrically connected to the first end of the semiconductor layer through the first conductive via hole, and a second portion electrically connected to the first portion through a fifth conductive via hole, wherein the second portion is spaced apart from the first signal line by the first gap, the first portion is in a same layer as the source or the drain, and the second portion is in a same layer as the first signal line; and the second connecting portion comprises: a third portion electrically connected to the second end of the semiconductor layer through the second conductive via hole, and a fourth portion electrically connected to the third portion through a sixth conductive via hole, wherein the fourth portion is spaced apart from the second signal line by the second gap, the third portion is in a same layer as the source or the drain, and the fourth portion is in a same layer as the second signal line.

11. The display substrate according to claim 8, wherein the third connecting portion comprises: a fifth portion electrically connected to the third end of the semiconductor layer through the fourth conductive via hole, and a sixth portion electrically connected to the fifth portion through a seventh conductive via hole, wherein the sixth portion is spaced apart from the third protrusion through the third gap, the fifth portion is in a same layer as the source or the drain, and the sixth portion is in a same layer as the first signal line or the second signal line.

12. The display substrate according to claim 7, wherein:

the first protrusion comprises: a first sub-protrusion connected to a main body portion of the first signal line, and a second sub-protrusion electrically connected to the first sub-protrusion through an eighth conductive via hole, wherein the second sub-protrusion is in a same layer as the source or the drain;

the first connecting portion comprises a seventh portion electrically connected to the first end of the semiconductor layer through the first conductive via hole, wherein the seventh portion is spaced apart from the second sub-protrusion by the first gap, and the seventh portion is in a same layer as the source or the drain;

the second protrusion comprises: a third sub-protrusion connected to a main body portion of the second signal line, and a fourth sub-protrusion electrically connected to the third sub-protrusion through a ninth conductive via hole, wherein the fourth sub-protrusion is in a same layer as the source or the drain; and the second connecting portion comprises an eighth portion electrically connected to the second end of the semiconductor layer through the second conductive via hole, wherein the eighth portion is spaced apart from the fourth sub-protrusion by the second gap, and the eighth portion is in a same layer as the source or the drain.

13. The display substrate according to claim 8, wherein:

the third protrusion comprises: a fifth sub-protrusion electrically connected to the third signal line through the third conductive via hole, and a sixth sub-protrusion electrically connected to the fifth sub-protrusion through a tenth conductive via hole, wherein the fifth sub-protrusion is in a same layer as the first signal line or the second signal line, and the sixth sub-protrusion is in a same layer as the source or the drain; and the third connecting portion comprises a ninth portion electrically connected to the third end of the semiconductor layer through the fourth conductive via hole, wherein the ninth portion is spaced apart from the sixth sub-protrusion by the third gap, and the ninth portion is in a same layer as the source or the drain.

14. The display substrate according to claim 2, wherein:

the signal line comprises a first signal line and a second signal line, and the semiconductor layer is between the first signal line and the second signal line, and the semiconductor layer is an integral semiconductor layer;

a shape of the semiconductor layer is rectilinear, T-shaped or curved;

a resistivity of the semiconductor layer ranges from 1 kilohm·meter (kΩ·m) to 10 kΩ·m;

a width of the gap is less than a width of the signal line; or a width of the gap ranges from 1 micron to 2 microns.

15. The display substrate according to claim 1, further comprising:

a dummy pixel structure between the gate driving circuit and the pixel structure, wherein the dummy pixel structure is not electrically connected to the signal line, the pixel structure is closer to the dummy pixel structure than the gate driving circuit, and the semiconductor structure is between the gate driving circuit and the dummy pixel structure.

16. The display substrate according to claim 1, wherein:

the gate driving circuit comprises: a first sub-gate driving circuit close to a first edge of the base substrate and a second sub-gate driving circuit close to a second edge of the base substrate, wherein the second edge is opposite to the first edge; and the semiconductor structure comprises: a first semiconductor structure between the first sub-gate driving circuit and the pixel structure, and a second semiconductor structure between the second sub-gate driving circuit and the pixel structure.

17. A display substrate, comprising:

a base substrate;

a signal line on the base substrate;

a thin film transistor on the base substrate, wherein the thin film transistor is electrically connected to the signal line, and the thin film transistor comprises: an active layer, a first insulating layer on a side of the active layer away from the base substrate, a gate on a side of the first insulating layer away from the base substrate, and a source and a drain each electrically connected to the active layer;

a semiconductor structure comprising a semiconductor layer, wherein the semiconductor layer is in a same layer as the active layer, and the semiconductor layer is electrically connected to the signal line; and a gate driving circuit and a pixel structure both on the base substrate, wherein the gate driving circuit and the pixel structure each are electrically connected to the signal line, and the pixel structure comprises the thin film transistor;

wherein the semiconductor structure is between the gate driving circuit and the pixel structure.

18. A display device, comprising: the display substrate according to claim 1.

19. A manufacturing method for a display substrate, comprising:

forming an active layer and a semiconductor layer on a base substrate, wherein the semiconductor layer is in a same layer as the active layer and spaced apart from the active layer, the active layer is a part of a thin film transistor, and the semiconductor layer is a part of a semiconductor structure;

forming a signal line, wherein the signal line is electrically connected to the thin film transistor;

forming a connecting portion electrically connected to the semiconductor layer, wherein the connecting portion is another part of the semiconductor structure, and the connecting portion is electrically connected to the signal line; and etching the connecting portion to form a gap;

wherein the manufacturing method further comprises: forming a gate driving circuit and a pixel structure both on the base substrate, wherein the gate driving circuit and the pixel structure each are electrically connected to the signal line, and the pixel structure comprises the thin film transistor, wherein the semiconductor structure is between the gate driving circuit and the pixel structure.

* * * * *